US 9,448,444 B2

(12) United States Patent
Yang et al.

(10) Patent No.: US 9,448,444 B2
(45) Date of Patent: Sep. 20, 2016

(54) DISPLAY DEVICE

(71) Applicant: Samsung Display Co., Ltd., Yongin (KR)

(72) Inventors: Dan Bi Yang, Gunpo-si (KR); Hyo Sik Kim, Yongin-si (KR); Ki Chul Shin, Seongnam-si (KR); Jae Hoon Jung, Anyang-si (KR); Min Ju Han, Seoul (KR); Ji Phyo Hong, Pyeongtaek-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 14/333,315

(22) Filed: Jul. 16, 2014

(65) Prior Publication Data

US 2015/0168787 A1  Jun. 18, 2015

(30) Foreign Application Priority Data

Dec. 18, 2013  (KR) .................. 10-2013-0158201

(51) Int. Cl.
*G02F 1/1343* (2006.01)
*G02F 1/1333* (2006.01)
*H01L 27/12* (2006.01)

(52) U.S. Cl.
CPC ... *G02F 1/134309* (2013.01); *G02F 1/133345* (2013.01); *H01L 27/124* (2013.01); *H01L 27/1218* (2013.01)

(58) Field of Classification Search
CPC ....... G02F 2001/134345; G02F 2001/136222; G02F 2001/134354; G02F 2001/134372; G02F 2001/13712; G02F 2001/133391; G02F 1/134309; G02F 1/133707; G02F 1/13624; G02F 1/136286; G02F 1/134336; G02F 1/136209; G02F 1/133; G02F 1/1333; G02F 1/133345; G02F 1/136; G02F 1/136213; G02F 1/136227; G02F 1/1335; G02F 1/133514; G02F 1/133512; G02F 1/1362; G02F 1/13306; G02F 1/1343; G02F 2201/123; G02F 2201/40; G02F 2203/30; G09G 2300/0447; G09G 2300/0426; G09G 2300/0443; G09G 2300/0876; G09G 2300/0421; G09G 3/3648; G09G 3/3607; G09G 3/3655; G09G 3/2074; G09G 3/3688; G09G 2320/028; G09G 2320/0209
USPC ............ 349/43, 139, 138, 42, 106, 33, 143, 349/144, 41, 110, 48, 38
See application file for complete search history.

(56) References Cited

U.S. PATENT DOCUMENTS

| 6,147,722 | A | 11/2000 | Shimada et al. |
| 7,190,503 | B2 | 3/2007 | Ide |
| 7,834,962 | B2 | 11/2010 | Satake et al. |
| 8,477,271 | B2 | 7/2013 | Enomoto |

(Continued)

FOREIGN PATENT DOCUMENTS

| JP | 2006-251161 | 9/2006 |
| JP | 2007-333818 | 12/2007 |

(Continued)

*Primary Examiner* — Thoi Duong
(74) *Attorney, Agent, or Firm* — H.C. Park & Associates, PLC

(57) ABSTRACT

A display device includes: a first insulation substrate; an insulating layer disposed on the first insulation substrate; a pixel electrode including a first subpixel electrode including a first subregion electrode disposed on the insulating layer and a second subregion electrode disposed below the insulating layer, and a second subpixel electrode disposed on the insulating layer, wherein a first voltage is applied to the first subpixel electrode and a second voltage is applied to the second subpixel; a second insulation substrate facing the first insulation substrate; and a common electrode disposed on the second insulation substrate and configured to receive a common voltage, wherein the second subregion electrode overlaps a portion of the second subpixel electrode.

18 Claims, 22 Drawing Sheets

(56) References Cited

U.S. PATENT DOCUMENTS

2009/0322974 A1    12/2009  Lee et al.
2014/0211142 A1*    7/2014  Kim .................. G02F 1/133707
                                                              349/138

FOREIGN PATENT DOCUMENTS

| JP | 2013-025015 | 2/2013 |
| KR | 10-2006-0102220 | 9/2006 |
| KR | 10-0659075 | 12/2006 |

* cited by examiner

DISPLAY DEVICE

CROSS-REFERENCE TO RELATED APPLICATION

This application claims priority from and the benefit of Korean Patent Application No. 10-2013-0158201, filed on Dec. 18, 2013, which is hereby incorporated for all the purposes as if fully set forth herein.

BACKGROUND

1. Field

The present invention relates to a display device.

2. Discussion of the Background

A liquid crystal display is one of the widely used flat panel displays presently and includes two display panels on which field generating electrodes, such as a pixel electrode and a common electrode, are formed, and a liquid crystal layer between the two display panels.

An image is displayed by applying a voltage to the field generating electrode to generate an electric field in the liquid crystal layer, determining orientation of liquid crystal molecules of the liquid crystal layer through the generated electric field, and controlling polarization of incident light.

The liquid crystal display also includes a switching device connected to each pixel electrode and a plurality of signal lines, such as gate lines, data lines and the like, for controlling the switching device to apply a voltage to the pixel electrode.

Among the liquid crystal displays, a vertically aligned mode liquid crystal display, in which a long axis of a liquid crystal molecule is arranged to be perpendicular to a display panel in a state where an electric field is not applied, has been spotlighted since it has a large contrast ratio and a wide reference viewing angle. The reference viewing angle refers to a viewing angle having a contrast ratio of 1:10 or an inter-gray scale luminance reversal limit angle For such a mode liquid crystal display, a method of dividing one pixel into two subpixels and applying different voltages to the two subpixels in order to make side visibility similar to front visibility to obtain different transmittances has been suggested.

However, when the side visibility becomes similar to the front visibility by dividing one pixel into two subpixels to obtain different transmittances thereof, luminance becomes high at a low gray scale or a high gray scale, and thus, gray scale expression at the side is difficult, thereby generating a problem of reduction of picture quality.

The above information disclosed in this Background section is only for enhancement of understanding of the background of the invention and therefore it may contain information that does not form the prior art that is already known in this country to a person of ordinary skill in the art.

SUMMARY

The exemplary embodiments of the present invention provide a display device which can make side visibility similar to front visibility and express an accurate gray scale in a low gray scale area. Further, the present invention provides a pixel structure which prevents texture generated due to a shift of a display panel in a curved display device.

Additional features of the invention will be set forth in the description which follows, and in part will be apparent from the description, or may be learned by practice of the invention.

An exemplary embodiment of the present invention provides a display device including: a first insulation substrate; an insulating layer disposed on the first insulation substrate; a pixel electrode including a first subpixel electrode including a first subregion electrode disposed on the insulating layer and a second subregion electrode disposed below the insulating layer, and a second subpixel electrode disposed on the insulating layer, wherein a first voltage is applied to the first subpixel electrode and a second voltage is applied to the second subpixel; a second insulation substrate facing the first insulation substrate; and a common electrode disposed on the second insulation substrate and configured to receive a common voltage, wherein the second subregion electrode overlaps a portion of the second subpixel electrode, a voltage difference between the first voltage and the common voltage is larger than a voltage difference between the second voltage and the common voltage, an area of the pixel electrode includes a first part where the first subregion electrode is located, a second part where the second subregion electrode overlaps the second subpixel electrode, and a third part where the second subpixel electrode does not overlap the second subregion electrode, and the first subregion electrode and the second subpixel electrode include branch parts extending in two different directions.

According to the display device described above, it is possible to make side visibility similar to front visibility and express an accurate gray scale in a low gray scale area. When a curved display device is provided, the texture generated due to a shift of a display panel can be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE EMBODIMENTS

Figure 1:
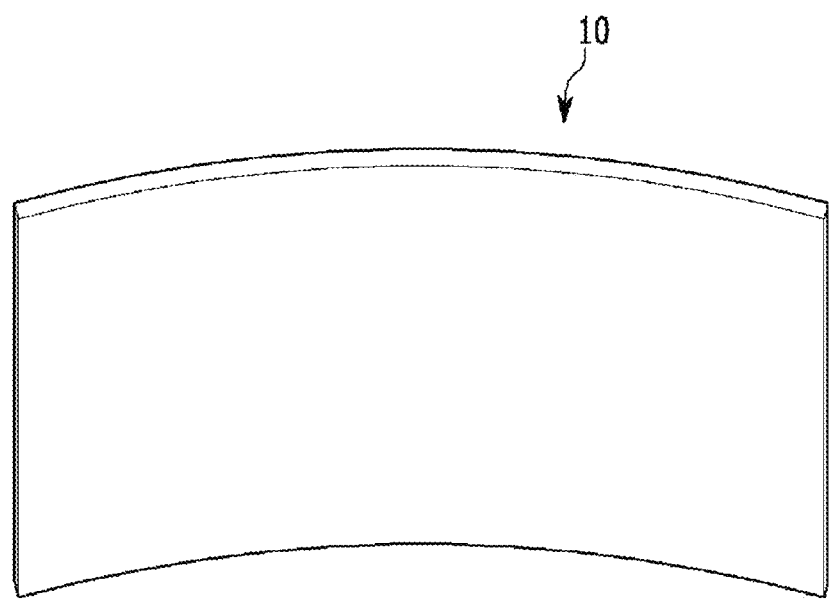
FIG. 1 is a perspective view of a curved display device according to an exemplary embodiment of the present invention.

Exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity It will be understood that when a layer is referred to as being "on" another layer or substrate, it can be directly on the other layer or substrate, or intervening them may also be present. Like reference numerals designate like elements throughout the specification. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

A display device according to an exemplary embodiment of the present invention will be described with reference to FIGS. 1, 2A, 2B, 3, and 4. FIG. 1 is a perspective view of a curved display device according to an exemplary embodiment of the present invention, FIG. 2A is a top plan view of one pixel according to an exemplary embodiment of the present invention, FIG. 3 is cross-sectional view taken along line III-III of FIG. 2A, and FIG. 4 is a cross-sectional view taken along line IV-IV of FIG. 2A.

Referring to FIG. 1, a display device 10 according to an exemplary embodiment of the present invention is a curved display device. The display device may be formed in a curved type by bending the display device in a concave shape or a convex shape. Although the specification illustrates a landscape type which has a vertical length shorter than a horizontal length in a viewpoint of a viewer and is curved in a horizontal direction, the present invention is not limited thereto, the display device may be a portrait type which has a vertical length longer than a horizontal length and is curved in a vertical direction. The present invention of the display device may also be a flat display device.

Figure 2A:
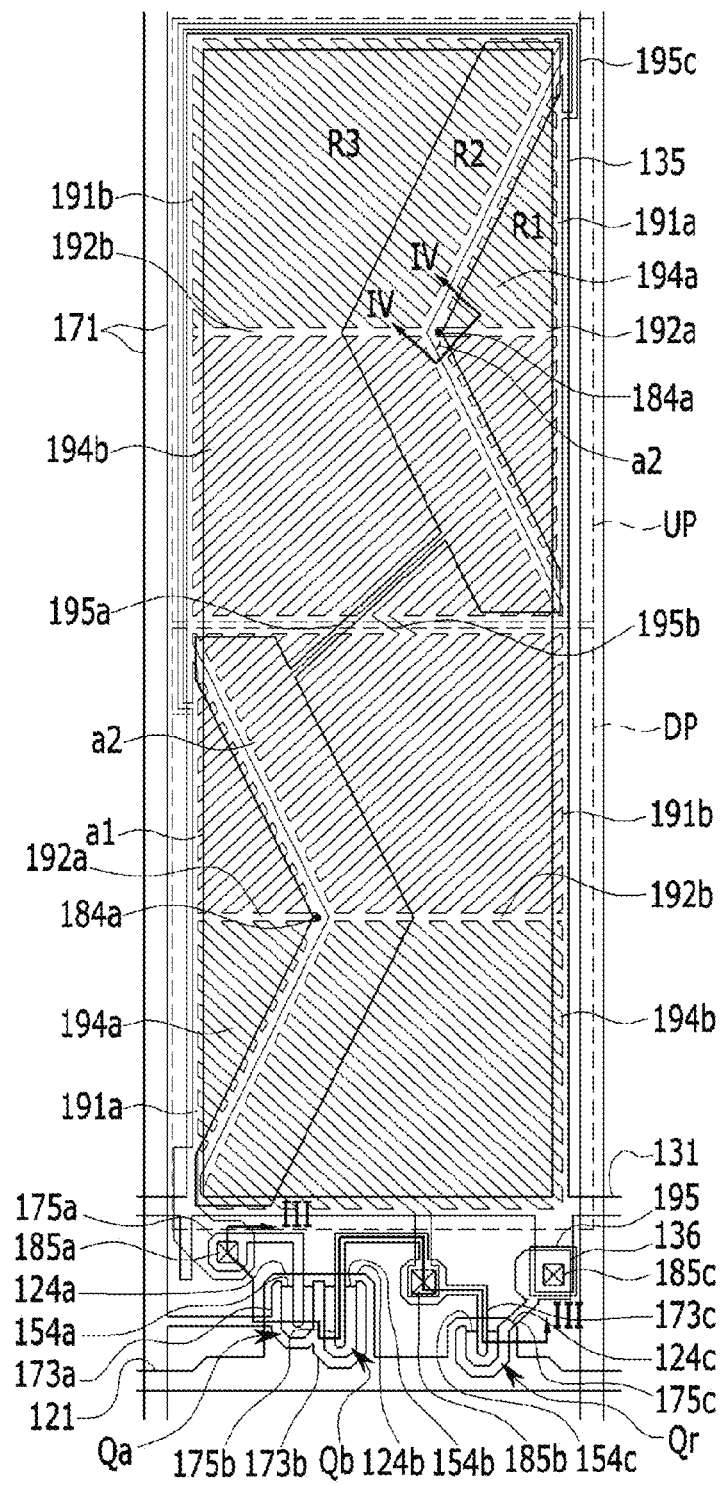
FIG. 2A is a top plan view of one pixel according to an exemplary embodiment of the present invention and FIG. 2B illustrates an arrangement direction of a liquid crystal in one pixel area according to an exemplary embodiment of the present invention.
Figure 2B:
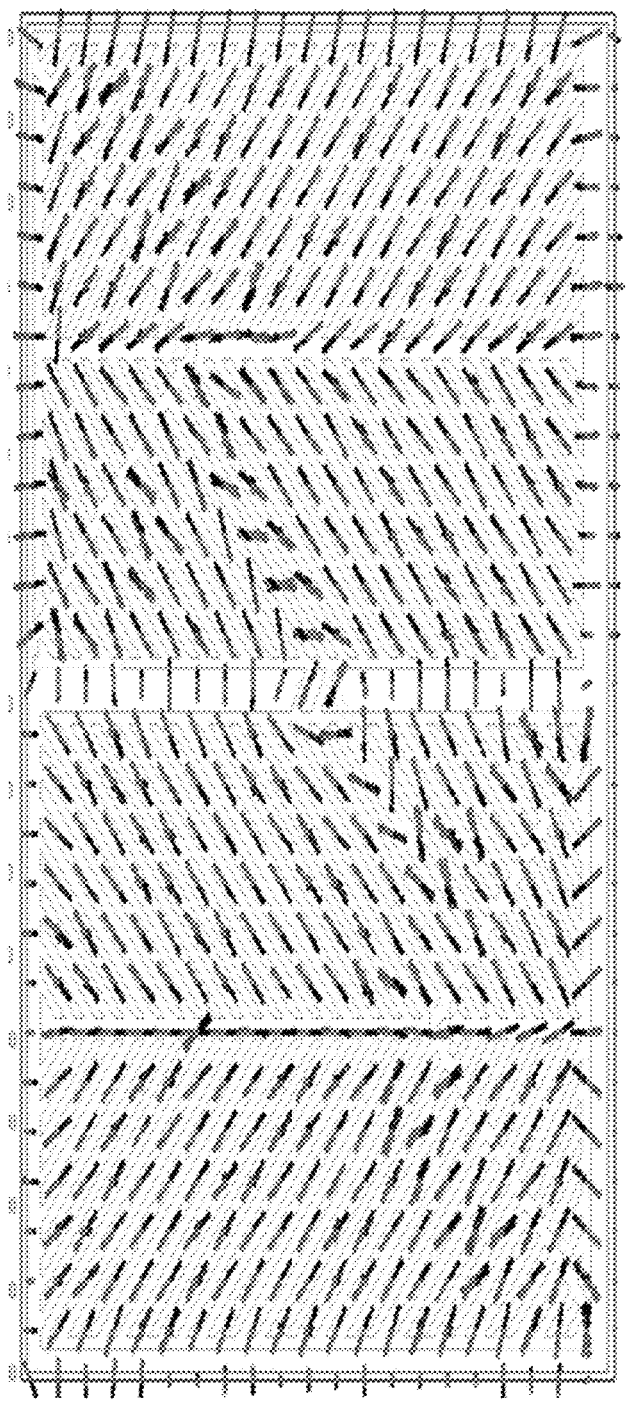
Figure 3:
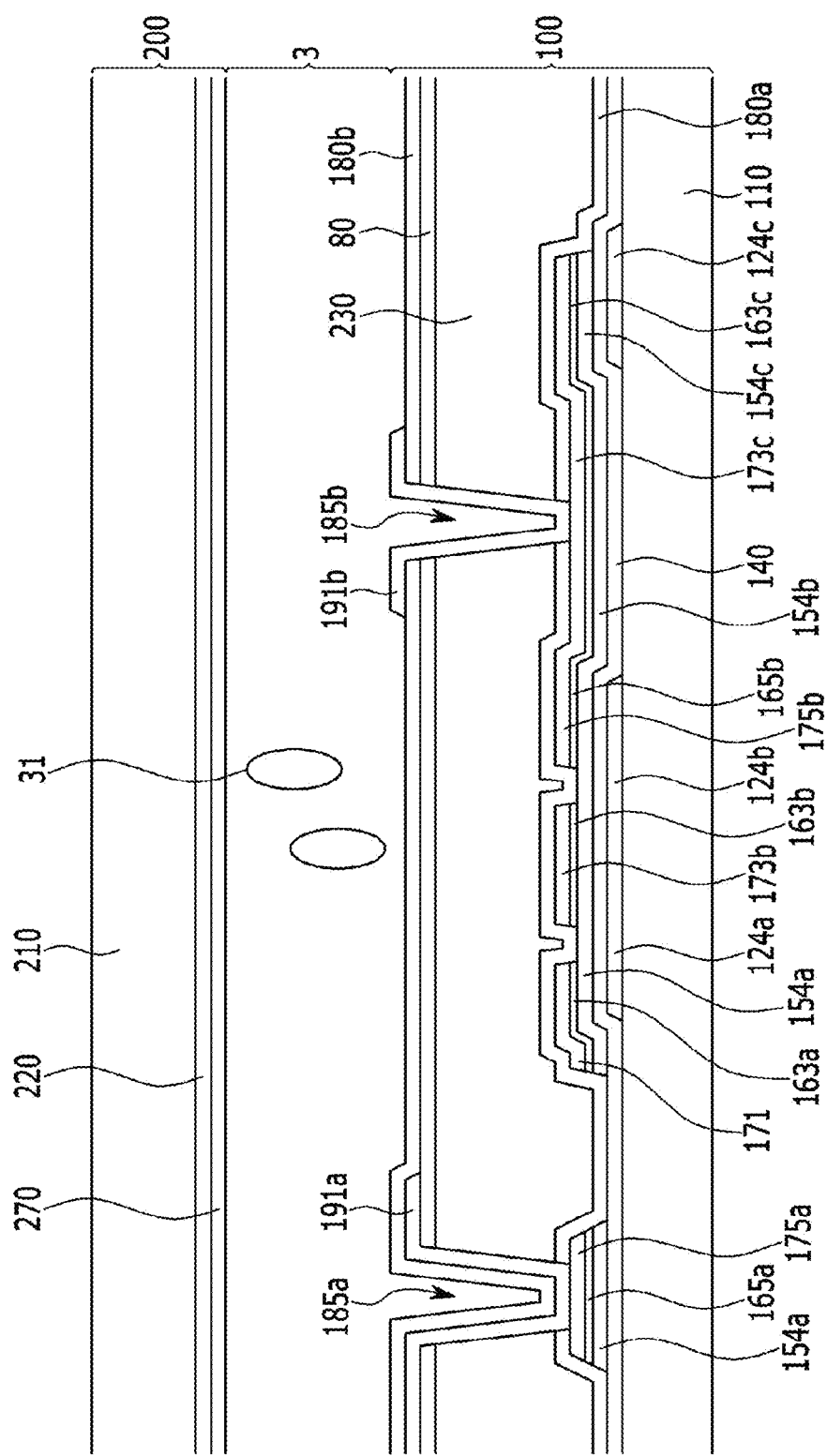
FIG. 3 is a cross-sectional view taken along line III-III of FIG. 2.
Figure 4:
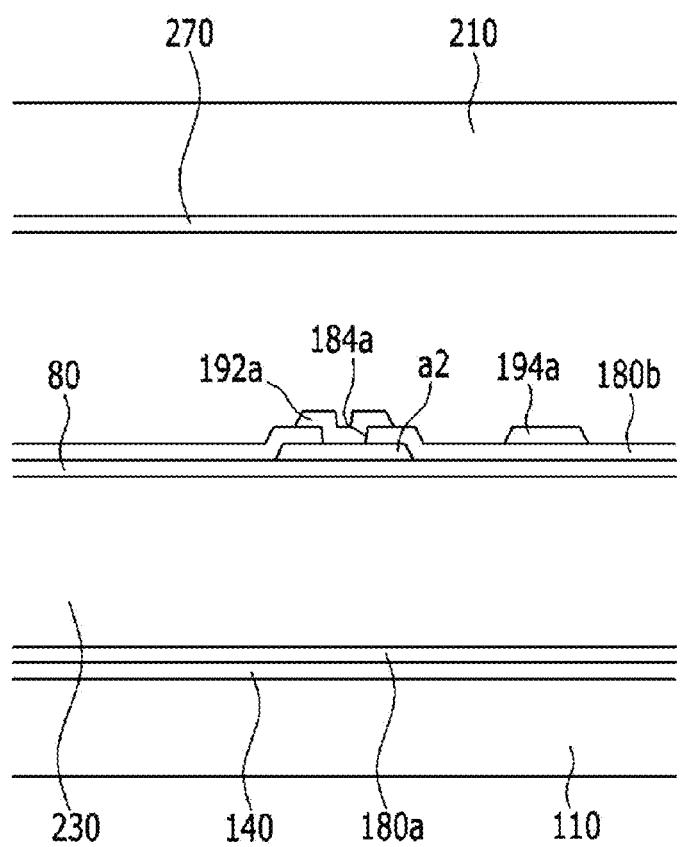
FIG. 4 is a cross-sectional view taken along line IV-IV of FIG. 2.

Referring to FIGS. 2A and 3, the display device 10 includes a lower display panel 100 and an upper display panel 200 facing each other, and a liquid crystal layer 3 including liquid crystal molecules 31 interposed between the two display panels 100 and 200.

The lower display panel 100 will be first described.

A gate line 121, a reference voltage line 131, and a storage electrode 135 are formed on a first insulation substrate 110 made of transparent glass, plastic or the like. The gate line 121 mainly extends in a horizontal direction and transmits a gate signal.

The gate line 121 includes a first gate electrode 124a, a second gate electrode 124b, a third gate electrode 124c, and a wide end part (not illustrated) for a connection with another layer or an external driving circuit.

The reference voltage line 131 may extend in parallel to the gate line 121 and has an extension part 136, and the extension part 136 is connected with the third drain electrode 175c through a contact hole 185c described below.

The reference voltage line 131 includes the storage electrode 135 surrounding a pixel area.

A gate insulating layer 140 is formed on the gate line 121, the reference voltage line 131, and the storage electrode 135.

A first semiconductor 154a, a second semiconductor 154b, and a third semiconductor 154c, which can be made of amorphous or crystalline silicon, are formed on the gate insulating layer 140.

A plurality of ohmic contacts 163a, 163b, 163c, 165a, and 165b are formed on the first semiconductor 154a, the second semiconductor 154b, and the third semiconductor 154c. When the semiconductors 154a, 154b, and 154c are oxide semiconductors, the ohmic contacts may be omitted.

Data conductors including a data line 171, a first source electrode 173a, a second source electrode 173b, a third source electrode 173c, a first drain electrode 175a, a second drain electrode 175b, a third source electrode 173c, and a third drain electrode 175c are formed on the ohmic contacts 163a, 163b, 163c, 165a, 165b, and the gate insulation layer 140.

The second drain electrode 175b is electrically connected with the third source electrode 173c, and the third drain electrode 175c is electrically connected with the extension part 136 of the reference voltage line 131 through the contact hole 185c.

The first gate electrode 124a, the first source electrode 173a, and the first drain electrode 175a form a first thin film transistor Qa with a first semiconductor 154a. A channel of the thin film transistor is formed on a part of the semiconductor 154a, between the first source electrode 173a and the first drain electrode 175a. Similarly, the second gate electrode 124b, the second source electrode 173b, and the second drain electrode 175b form a second thin film transistor Qb with a second semiconductor 154b. A channel of the thin film transistor is formed on a part of the semiconductor 154b, between the second source electrode 173b and the second drain electrode 175b. The third gate electrode 124c, the third source electrode 173c, and the third drain electrode 175c form a third thin film transistor, that is, a voltage dividing transistor Qr with a third semiconductor 154c. A channel of the third thin film transistor is formed on a part of the semiconductor 154c, between the third source electrode 173c and the third drain electrode 175c. A voltage dividing switching element Qr is controlled according to a gate signal transmitted by the gate line 121. When the voltage dividing switching element Qr and a second switching element Qb are turned on, a data voltage transmitted by the data line 171 may be divided by the second switching element Qb and the voltage dividing switching element Qr, and transmitted to a liquid crystal capacitor.

A first passivation layer 180a, which can be made of an inorganic insulator, such as silicon nitride or silicon oxide, is formed on the data conductors 171, 173a, 173b 173c, 175a, 175b, and 175c, and exposed parts of the semiconductors 154a, 154b, and 154c.

A color filter 230 is located on the first passivation layer 180a.

A light blocking member (not illustrated) may be located on an area where the color filter 230 is not located and on a part of the color filter 230. The light blocking member is also called a black matrix and prevents light leakage.

A capping layer 80 is located on the color filter 230. The capping layer 80 prevents the color filter 230 from detaching and suppresses contamination of the liquid crystal layer 3 by an organic material, such as a solvent flowing in from the color filter, so as to prevent defects, such as an afterimage generated when a screen is driven.

Referring to FIG. 4, a second subregion electrode a2 of a first subpixel electrode 191a is located on the capping layer 80, and an insulating layer 180b is located on the second subregion electrode a2.

A first subregion electrode a1 of the first subpixel electrode 191a and a second subpixel electrode 191b are located on the insulating layer 180b. The first subregion electrode a1 and the second subregion electrode a2 of the first subpixel electrode 191a may be connected to each through the contact hole 184a.

Referring back to 2A, the first subpixel electrode 191a and the second subpixel electrode 191b receive data voltages from the first drain electrode 175a and the second drain electrode 175b, through a first contact hole 185a and a second contact hole 185b, respectively. The first subregion electrode a1 and the second subregion electrode a2 are electrically connected through the contact hole 184a. As such, the first subregion electrode a1 and the second subregion electrode a2 receive the same data voltage.

More specifically, one pixel area of the display device according to the present exemplary embodiment includes the first subpixel electrode 191a, the second subpixel electrode 191b, and the common electrode 270. The pixel area includes an upper unit electrode UP and a lower unit electrode DP distinguished by their positions, and a first part R1, a second part R2, and a third part R3 distinguished by sizes of applied electric fields.

The first subregion electrode a1 of the first subpixel electrode 191a located on the upper unit electrode UP and the lower unit electrode DP may be located on a different layer from the second subregion electrode a2 of the first subpixel electrode 191a, and, for example, the first subregion electrode a1 and the second subregion electrode a2 may be located on different layers with an insulating layer disposed in between.

The second subregion electrode a2 may further include a first connector 195a for connecting the first subregion electrodes a1 located on the upper unit electrode UP and the lower unit electrode DP, and the first connector 195a has no limitation to its shape.

The first subregion electrode a1 is electrically connected to the second subregion electrode a2 connected to the first thin film transistor Qa, and thus may receive the first voltage.

The first subregion electrode a1 located on one upper unit electrode UP or lower unit electrode DP may be disposed in a triangle shape substantially having one bottom side and two oblique sides, and the one bottom side may correspond to an edge of one pixel area.

Further, the first subregion electrodes a1 of the first subpixel electrodes 191a located on the upper unit electrode UP and the lower unit electrode DP may be connected to each other, and may be connected through, for example, a third connector 195c extending along the edge of the pixel area.

The second subregion electrode a2 is connected to the first thin film transistor Qa, and thus may receive the first voltage indicating a high gray scale.

The second subpixel electrode 191b may include an edge parallel to the edge of one pixel area and oblique sides corresponding to two oblique sides included in the first subregion electrode a1 of the first subpixel electrode 191a. Accordingly, in the upper unit electrode UP or the lower unit electrode DP, the second subpixel electrode 191b and the first subregion electrode a1 of the first subpixel electrode 191a may have quadrangular shapes having similar horizontal and vertical lengths while not overlapping each other on a plane.

Further, the second subpixel electrodes 191b located on the upper unit electrode UP and the lower unit electrode DP may be electrically connected through a second connector 195b. For example, the second connector 195b extends from ends of second fine branch parts 194b of the second subpixel electrodes 191b located on the upper unit electrode UP and the lower unit electrode DP, and thus, may connect the upper unit electrode UP and the lower unit electrode DP.

The second subpixel electrode 191b is connected to the second thin film transistor connected to the voltage dividing transistor and thus may receive a second voltage lower than the first voltage.

In the upper unit electrode UP, an area where the first subregion electrode a1 is located is defined as a first part R1, an area where the second subregion electrode a2 overlaps the second subpixel electrode 191b is defined as a second part R2, and an area where the second subpixel electrode 191b does not overlap the second subregion electrode a2 is defined as a third part R3.

According to a difference between the voltage applied to each pixel electrode and the common voltage, intensity of an electric field applied to the liquid crystal layer located on the first part R1 is largest and intensity of an electric field applied to the liquid crystal layer located on the third part R3 is smallest. Since the second part R2 is influenced by the electric field by the second subregion electrode a2 of the first subpixel electrode 191a, the intensity of an electric field applied to the liquid crystal located on the second part R2 is smaller than the intensity of the electric field applied to the liquid crystal layer located on the first part R1 and larger than the intensity of the electric field applied to the liquid crystal layer located on the third part R3.

As described above, the display device according to the exemplary embodiment of the present invention divides one pixel area into the first part R1 where the first subpixel electrode 191a to which the relatively high first voltage is applied is located, the second part R2 where a part of the first subpixel electrode 191a and a part of the second subpixel electrode 191b to which the relatively low second voltage is applied overlap each other with an insulating layer disposed in between, and the third part R3 where only the second subpixel electrode 191b to which the relatively low second voltage is applied is located. It will be described below in more detail with reference to FIGS. 5 to 8.

Hereinafter the upper display panel 200 is described.

Referring back to FIGS. 3 and 4, a light blocking member 220 and the common electrode 270 are formed on a second insulation substrate 210 made of transparent glass or plastic.

However, the light blocking member 220 may be located on the lower display panel 100 in a liquid crystal display according to another exemplary embodiment of the present invention, and the color filter may be located on the upper display panel 200 in a liquid crystal display according to another exemplary embodiment of the present invention.

Alignment layers may be formed on inside surfaces of the display panels 100 and 200 and the alignment layer may be a vertical alignment layer.

Polarizers may be located on outer surfaces of the two display panels 100 and 200, and transmission axis of the two polarizers are orthogonal to each other and one of the transmission axis is preferably parallel to the gate line 121. However, the polarizer may be arranged at only the outer surface of any one of the two display panels 100 and 200.

The liquid crystal layer 3 has negative dielectric anisotropy, and the liquid crystal molecules of the liquid crystal layer 3 are aligned such that a long axis thereof forms a right angle with respect to the surfaces of the two display panels 100 and 200 in a state where there is no electric field. Accordingly, when there is no electric field, incident light may be blocked and cannot pass through a crossed polarizer.

At least one of the liquid crystal layer 3 and the alignment layer may include a photo reactive material, more specifically, reactive mesogen.

Figure 14:
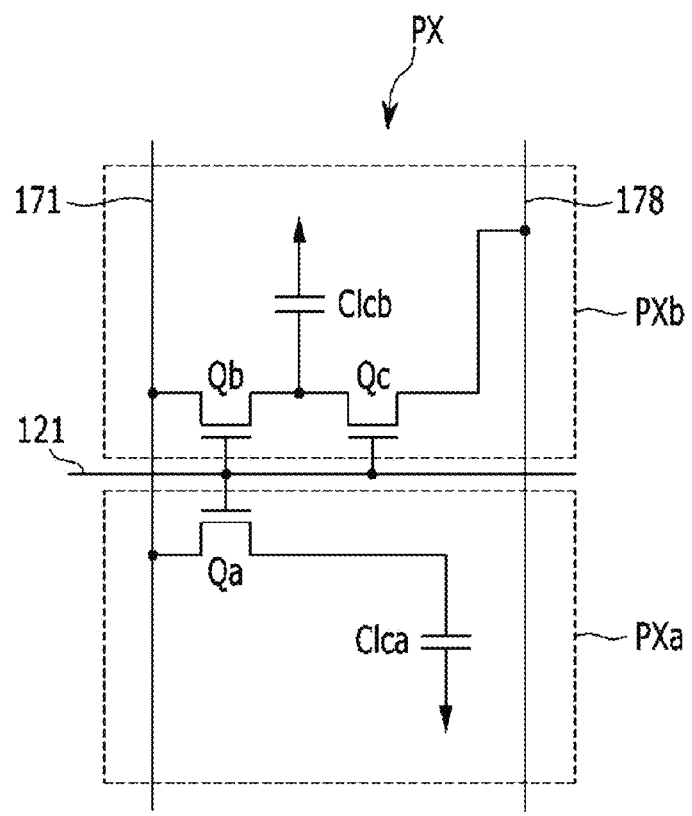
FIG. 14 is a circuit diagram according to an exemplary embodiment of the present invention.

A method of driving the display device according to the present exemplary embodiment, for example, the liquid crystal display will be briefly described referring to a circuit diagram illustrated in FIG. 14.

When a gate on signal is applied to the gate line 121, the gate on signal is applied to the first gate electrode 124a, the second gate electrode 124b, and the third gate electrode 124c, and accordingly, the first switching element Qa, the second switching element Qb, and the voltage dividing transistor Qr corresponding to the third switching element, are turned on. Accordingly, a data voltage applied to the data line 171 may be applied to the first subpixel electrode 191a and the second subpixel electrode 191b through the turned on first switching element Qa and second switching element Qb, respectively. At this time, the first voltage having the same size is applied to the first subpixel electrode 191a and the second subpixel electrode 191b. However, the voltage applied to the second subpixel electrode 191b is divided through the voltage dividing transistor Qr corresponding to the third switching element connected to the second switching element Qb in series and thus forms the second voltage. Accordingly, the voltage applied to the second subpixel electrode 191b becomes smaller than the voltage applied to the first subpixel electrode 191a.

One pixel area of the display device according to the present exemplary embodiment includes the first part R1 where only the first subregion electrode a1 of the first subpixel electrode 191a is located, the second part R2 where the second subregion electrode a2 of the first subpixel electrode 191a is located and overlaps the second subpixel electrode 191b, and the third part R3 where a part of the second subpixel electrode 191b is located. The second subpixel electrode 191b does not overlap the second subregion electrode a2 of the first subpixel electrode 191a in the third part R3.

Further, one pixel area includes the upper unit electrode UP and the lower unit electrode DP located on the lower display panel 100 and the common electrode 270 located on the upper display panel 200. Accordingly, each of the upper unit electrode UP and the lower unit electrode DP may include the first part R1, the second part R2, and the third part R3, and each of the first part R1, the second part R2, and the third part R3 may be divided into two areas in each of the upper unit electrode UP and the lower unit electrode DP. As a result, each of the parts may be divided into six areas in one pixel area.

Further, through FIG. 2A, arrangements of the liquid crystal molecules in the pixel area according to the present invention may be known. Specifically, a first fine branch part 194a and a second fine branch part 194b may respectively extend from a first side of a first horizontal stem part 192a and a second horizontal stem part 192b in the upper unit electrode UP in a first direction. Liquid crystal molecules of the liquid crystal layer located at the first side of the first and second horizontal stem parts may be arranged in the first direction.

Further, the first fine branch part 194a and the second fine branch part 194b may respectively extend from a second side of a first horizontal stem part 192a and a second horizontal stem part 192b in the upper unit electrode UP in a second direction. The liquid crystal molecules 31 of the liquid crystal layer located at the second side of the first and second horizontal stem parts may be arranged in the second direction.

Similarly, the first fine branch part 194a and the second fine branch part 194b located at a first side of the first horizontal stem part 192a and the second horizontal stem part 192b in the lower unit electrode DP in the second direction. The liquid crystal molecules of the liquid crystal layer 3 located at the first side of the first and second horizontal stem parts may be arranged in the second direction.

Further, the first fine branch part 194a and the second fine branch part 194b located at a second side of the first horizontal stem part 192a and the second horizontal stem part 192b in the lower unit electrode DP in the first direction. The liquid crystal molecules of the liquid crystal layer located at the second side of the first and second horizontal stem parts may be arranged in the first direction.

Figure 5:
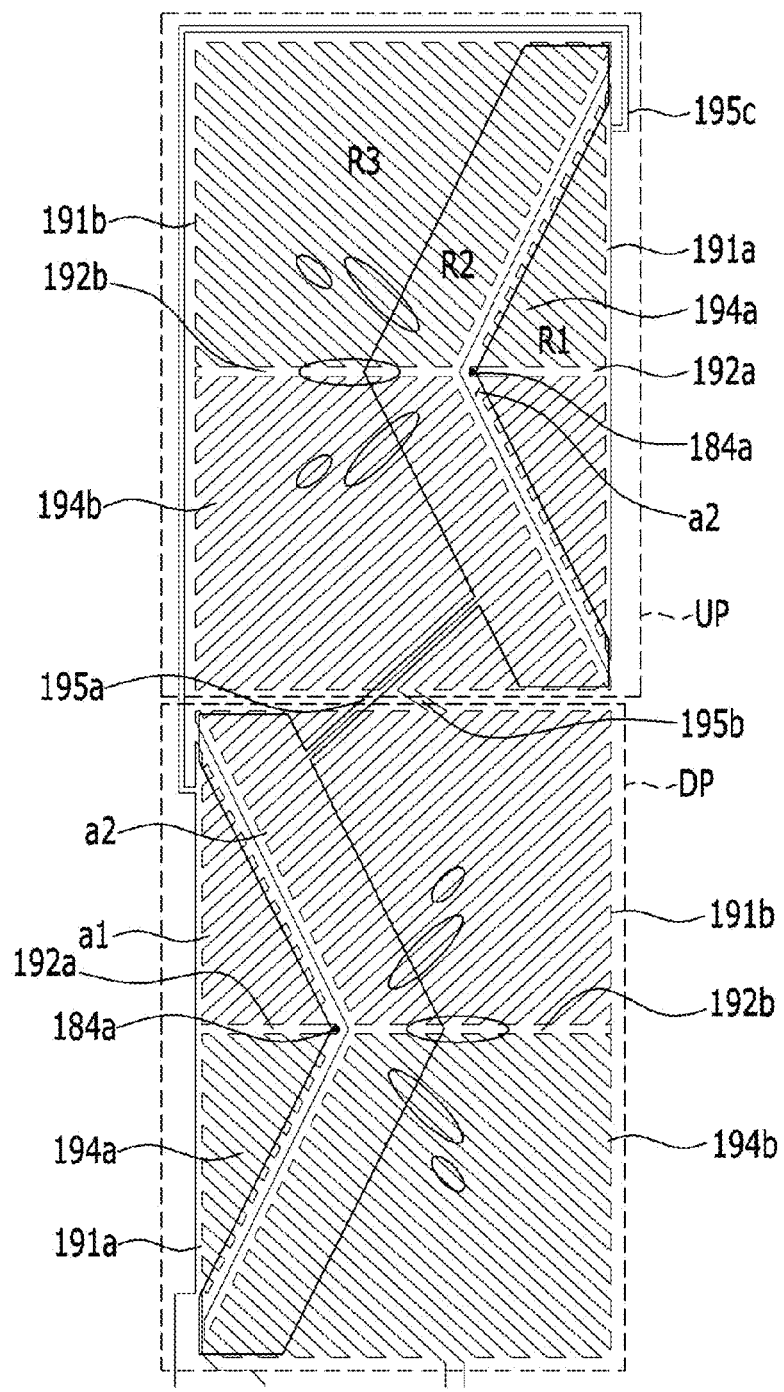
FIG. 5 is a top plan view of a basic pixel according to an exemplary embodiment of the present invention.
Figure 6:
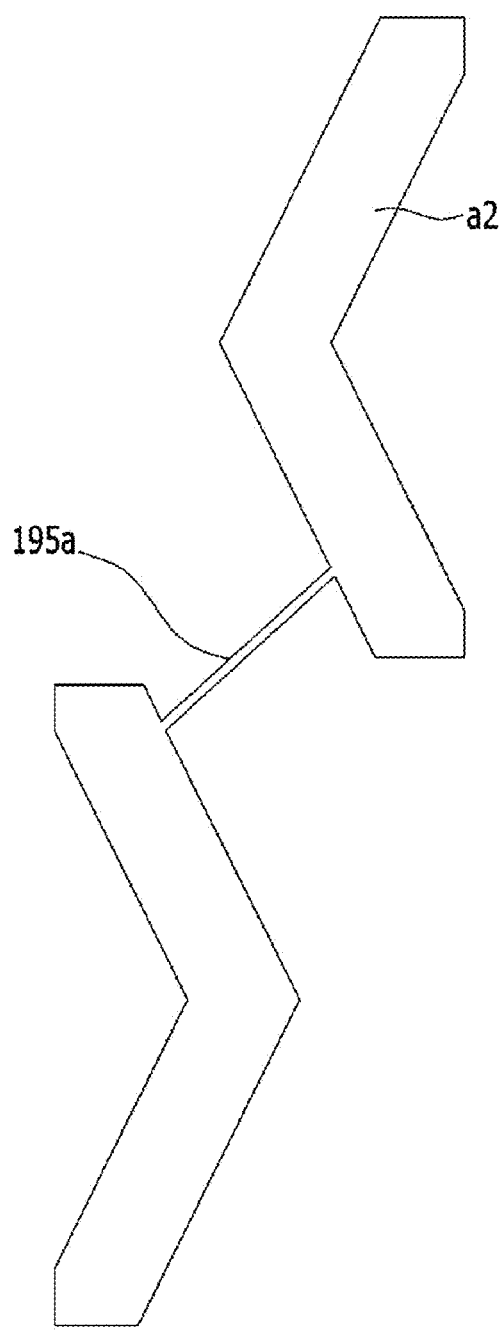
FIG. 6 is a top plan view of a second subregion electrode of a first subpixel electrode according to an exemplary embodiment of the present invention.
Figure 7:
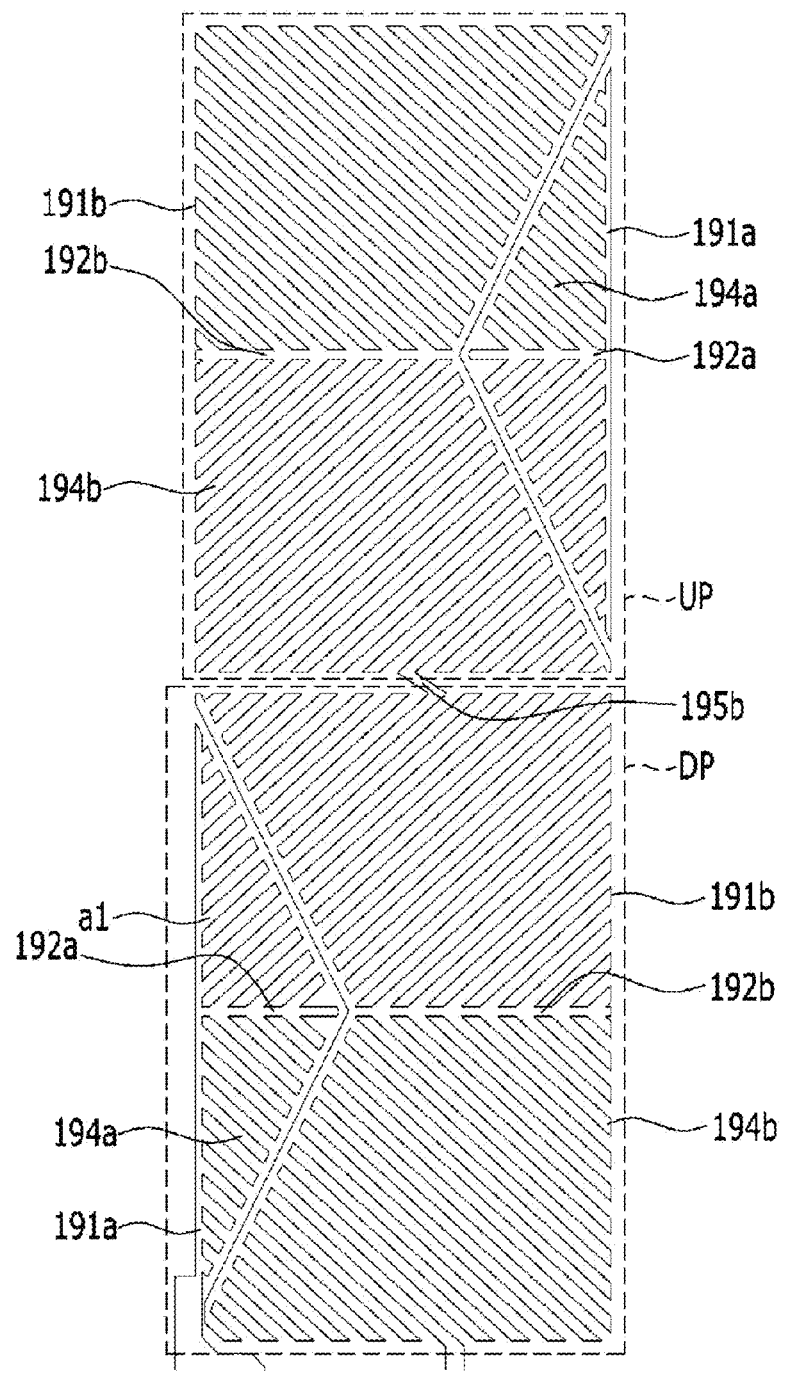
FIG. 7 is a top plan view of a first subregion electrode of a first subpixel electrode and a second subpixel electrode according to an exemplary embodiment of the present invention.
Figure 8A:
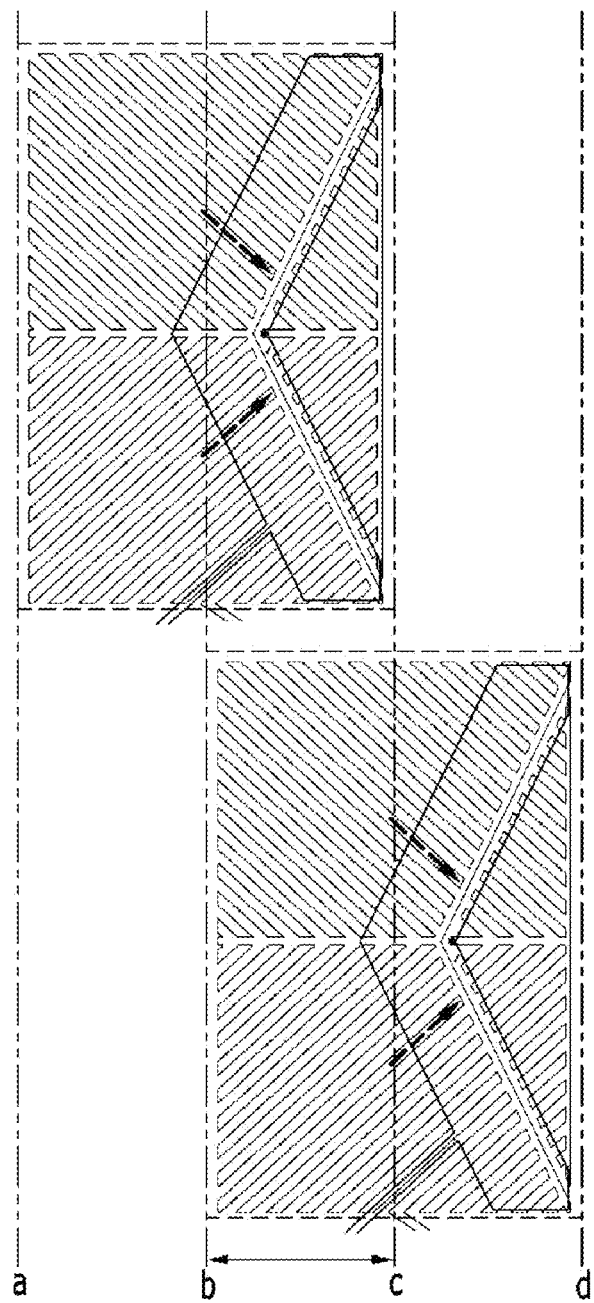
FIGS. 8A and 8B illustrate a shift of a panel according to manufacturing of a curved display device.
Figure 8B:
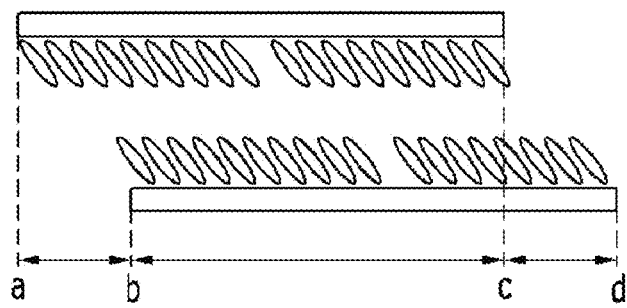

A shape of a basic pixel electrode according to an exemplary embodiment of the present invention will be described in detail with reference to FIGS. 5 to 8. FIG. 5 is a top plan view of a basic pixel according to an exemplary embodiment of the present invention, FIG. 6 is a top plan view of the second subregion electrode a2 of the first subpixel electrode 191a according to an exemplary embodiment of the present invention, FIG. 7 is a top plan view of the first subregion electrode a1 of the first subpixel electrode 191a and the second subpixel electrode according to an exemplary embodiment of the present invention, and FIGS. 8A and 8B illustrate a shift of a panel according to manufacturing of the curved display device.

Referring to FIG. 5, one pixel area of the display device according to the present exemplary embodiment includes the first subpixel electrode 191a and the second subpixel electrode 191b. The pixel area includes the upper unit electrode UP and the lower unit electrode DP that are distinguished by their positions and may be divided into the first part R1, the second part R2, and the third part R3, which are distinguished by sizes of applied electric fields.

First, in connection with the first subpixel electrode 191a and the second subpixel electrode 191b, the upper unit electrode UP and the lower unit electrode DP divided by their positions will be described with reference to FIGS. 5 to 7. One upper unit electrode UP or lower unit electrode DP includes the first subpixel electrode 191a and the second subpixel electrode 191b, and one upper unit electrode UP, one lower unit electrode DP, and one common electrode 270 form one pixel area.

Referring to FIG. 5, the first subregion electrode a1 of the first subpixel electrode 191*a* located on the upper unit electrode UP and the lower unit electrode DP is located on a layer different from that of the second subregion electrode a2 of the first subpixel electrode 191*a*, and, for example, the first subregion electrode a1 and the second subregion electrode a2 may be located on different layers with an insulating layer disposed in between.

The second subregion electrode a2 is in a shape having an oblique side parallel to an oblique side of the first subregion electrode a1. For example, the second subregion electrode a2 looks like a separated space between the first subregion electrode a1 and the second subpixel electrode 191*b* on the plane as illustrated in FIG. 4. However, the second subregion electrode a2 is formed to be wider than the separated space in order to overlap the second subpixel electrode 191*b*.

The first subregion electrode a1 is connected with the second subregion electrode a2 through the contact hole 184*a* and receives the first data voltage applied to the second subregion electrode a2.

Further, the second subregion electrode a2 may further include the first connector 195*a* for connecting the second subregion electrodes a2 located on the upper unit electrode UP and the lower unit electrode DP, and the first connector 195*a* has no limit to its shape.

Accordingly, each of the upper unit electrode UP and the lower unit electrode DP includes the first subregion electrode a1, and the first subregion electrodes a1 located on the upper unit electrode UP and the lower unit electrode DP may have the same shape disposed on positions symmetrical to each other.

Next, the first subregion electrode a1 of the first subpixel electrode 191*a* will be described. The first subregion electrode a1 located either on the upper unit electrode UP or the lower unit electrode DP may be a triangle substantially having one bottom side and two oblique sides, and the one bottom side may correspond to an edge of one pixel area.

The first subregion electrode a1 of the first subpixel electrode 191*a* located on the upper unit electrode UP includes the first horizontal stem part 192*a* located at a center of the first subregion electrode a1 and a plurality of first fine branch parts 194*a* extending from the first horizontal branch part 192*a* in two different directions. At this time, the first horizontal stem part 192*a* may be perpendicular to the one bottom side.

Similarly, the first subregion electrode a1 located on the lower unit electrode DP may include the first horizontal stem part 192*a* and the first fine branch parts 194*a*, and electrode shapes of the lower unit electrode DP and the upper unit electrode UP may be symmetrical to each other.

The plurality of first fine branch parts 194*a* may incline at an angle of about 40 or 50 degrees with respect to the first horizontal stem part 192*a*. By a fringe field generated by edges of the plurality of first fine branch parts 194*a*, the liquid crystal molecules 31 of the liquid crystal layer 3 located on the first part R1 lie in two different directions. More specifically, the liquid crystal molecules 31 may incline in a direction parallel to a length direction in which the plurality of first fine branch parts 194*a* extend.

Further, the first subregion electrodes a1 of the first subpixel electrodes 191*a* located on the upper unit electrode UP and the lower unit electrode DP may be connected to each other, and may be connected through, for example, the third connector 195*c* extending along the edge of the pixel area.

The second subregion electrodes a2 of the first subpixel electrodes 191*a* located on the upper unit electrode UP and the lower unit electrode DP may have the same shape, and may be located at the same positions or may be symmetrical to each other as illustrated in FIG. 4.

Next, the second subpixel electrode 191*b* may include the second horizontal stem part 192*b* and the second fine branch parts 194*b* extending from the second horizontal stem part 192*b* in two different directions in each of the upper unit electrode UP and the lower unit electrode DP.

The second subpixel electrode 191*b* may include an edge parallel to the edge of one pixel area and oblique sides corresponding to two oblique sides included in the first subregion electrode a1 of the first subpixel electrode 191*a*. Accordingly, in the upper unit electrode UP or the lower unit electrode DP, the second subpixel electrode 191*b* and the first subregion electrode a1 of the first subpixel electrode 191*a* may have quadrangular shapes having similar horizontal and vertical lengths while not overlapping each other on the plane. When the upper unit electrode UP and the lower unit electrode DP are combined in a vertical direction, they form one pixel area having a vertical length longer than a horizontal length.

The plurality of second fine branch parts 194*b* may incline at an angle of about 40 or 50 degrees with respect to the second horizontal stem part 192*b*. By a fringe field generated by edges of the plurality of second fine branch parts 194*b*, the liquid crystal molecules 31 of the liquid crystal layer 3 located on the third part R3 are aligned in two different directions. More specifically, the liquid crystal molecules 31 incline in a direction parallel to a length direction in which the plurality of second fine branch parts 194*b* extend.

Further, the first fine branch parts 194*a* and the second fine branch parts 194*b* may have the same slope. Specifically, the first fine branch part 194*a* and the second fine branch part 194*b* located at the same side with respect to their horizontal stem parts extend with the same slope. Accordingly, even in a case where different voltages are applied, the liquid crystal molecules 31 located at the same side may be arranged in the same direction.

Further, the second subpixel electrodes 191*b* located on the upper unit electrode UP and the lower unit electrode DP may be electrically connected through a second connector 195*b*. For example, the second connector 195*b* extends from an end of the second fine branch parts 194*b* of the second subregion electrode and thus may connect the upper unit electrode UP and the lower unit electrode DP.

Next, the first part R1, the second part R2, and the third part R3 which are divided according to a size of an applied electric field will be described.

First, in the first part R1, the first subregion electrode a1 of the first subpixel electrode 191*a* located on the lower display panel and the common electrode 270 located on the upper display panel 200 generate an electric field. At this time, a voltage applied to the first subregion electrode a1 has a largest value among voltages applied to one pixel area and forms an area having large intensity of the electric field with the common electrode 270.

Next, the second part R2 corresponds to an area where the second subregion electrode a2 of the first subpixel electrode 191*a* overlaps the second subpixel electrode 191*b*. By the electric field generated between the second subregion electrode a2 and the common electrode of the upper display panel, and the electric field generated between the second fine branch parts of the second subpixel electrode 191*b* and the common electrode, the liquid crystal molecules 31 of the liquid crystal layer 3 are arranged. At this time, the second part R2 is influenced by both the electric field by the second subregion electrode a2 of the first subpixel electrode 191*a* and the electric field by the second subpixel electrode 191b. Therefore, the intensity of the electric field applied to the liquid crystal layer located on the second part R2 is smaller than the intensity of the electric field applied to the liquid crystal layer located on the first part R1 and larger than the intensity of the electric field applied to the liquid crystal layer located on the third part R3.

Referring back to FIG. 5, in the third part R3, the second subpixel electrode 191b of the lower display panel 100 and the common electrode of the upper display panel 200 together generate the electric field. At this time, the voltage applied to the second subpixel electrode 191b is the second voltage applied through the second switching element, and the second voltage is smaller than the first voltage by the voltage dividing transistor. Accordingly, the electric field generated between the second subpixel electrode 191b and the common electrode is smaller than the electric field generated between the second subregion electrode a2 of the first subpixel electrode 191a and the common electrode.

Accordingly, the intensity of the electric field applied to the liquid crystal layer is largest at the first part R1 and smallest at the third part R3. Since the second part R2 is influenced by the electric field by the second subregion electrode a2 of the first subpixel electrode 191a, the intensity of the electric field applied to the liquid crystal at the second part R2 is smaller than the intensity of the electric field applied to the liquid crystal layer at the first part R1, and larger than the intensity of the electric field applied to the liquid crystal layer at the third part R3.

As described above, the display device according to the exemplary embodiment of the present invention divides one pixel area into three parts: the first part R1 where the first subpixel electrode 191a to which the relatively high first voltage is applied is located; the second part R2 where a part of the first subpixel electrode 191a and a part of the second subpixel electrode 191b to which the relatively low second voltage is applied overlap each other with an insulating layer disposed in between; and the third part R3 where only the second subpixel electrode 191b to which the relatively low second voltage is applied is located.

Accordingly, the intensities of the electric fields applied to the liquid crystal molecules corresponding to the first part R1, the second part R2, and the third part R3 are different and thus angles of the liquid crystal molecules are inclined different. As a result, the respective parts may have different luminance. As described above, when one pixel area is divided into three parts having different luminance, a rapid transmittance change from a gray scale change at a low gray scale and a high gray scale at the side may be prevented by gently controlling the transmittance change according to the gray scale, so that the side visibility can be similar to the front visibility and the accurate gray scale expression can be observed at the low gray scale and the high gray scale.

Meanwhile, the first fine branch part 194a and the second fine branch part 194b located at the first side of the horizontal stem parts 192a and 192b in the upper unit electrode UP may extend in the first direction. At this time, the liquid crystal molecules of the liquid crystal layer located at one side of the horizontal stem part may be arranged in the first direction.

Further, the first fine branch part 194a and the second fine branch part 194b located at the second side of the horizontal stem parts 192a and 192b in the upper unit electrode UP may extend in the second direction. At this time, liquid crystal molecules 31 of the liquid crystal layer located at the other side of the horizontal stem part may be arranged in the second direction.

Similarly, the first fine branch part 194a and the second fine branch part 194b located at the first side of the horizontal stem parts 192a and 192b in the lower unit electrode DP may extend in the second direction. At this time, liquid crystal molecules of the liquid crystal layer 3 located at the first side of the horizontal stem part may be arranged in the second direction.

Further, the first fine branch part 194a and the second fine branch part 194b located at the second side of the horizontal stem parts 192a and 192b in the lower unit electrode DP may extend in the first direction. At this time, liquid crystal molecules of the liquid crystal layer located at the second side of the horizontal stem part may be arranged in the first direction.

Referring to FIG. 8A, when power is applied to the display panel of the curved display device, the upper display panel 200 and the lower display panel 100 may be misaligned from side to side.

According to an exemplary embodiment of the present invention, the first fine branch parts and the second fine branch parts located at the first side of the horizontal stem parts 192a and 192b extend in the same direction, and accordingly, the liquid crystal molecules may also be arranged in the same direction.

Further, the first fine branch parts and the second fine branch parts located at the second side of the horizontal stem parts 192a and 192b also extend in the same direction, and accordingly, the liquid crystal molecules 31 may be arranged in the same second direction.

Accordingly, the fine branch parts located at upper and lower sides based on the horizontal stem parts 192a and 192b show the same liquid crystal molecule arrangement regardless of the applied voltage. As illustrated in FIG. 8B, even when the upper display panel 200 or the lower display panel 100 is misaligned from side to side, the liquid crystal molecules are equally arranged between the upper and lower electrodes, thereby reducing texture appearance.

Figure 9:
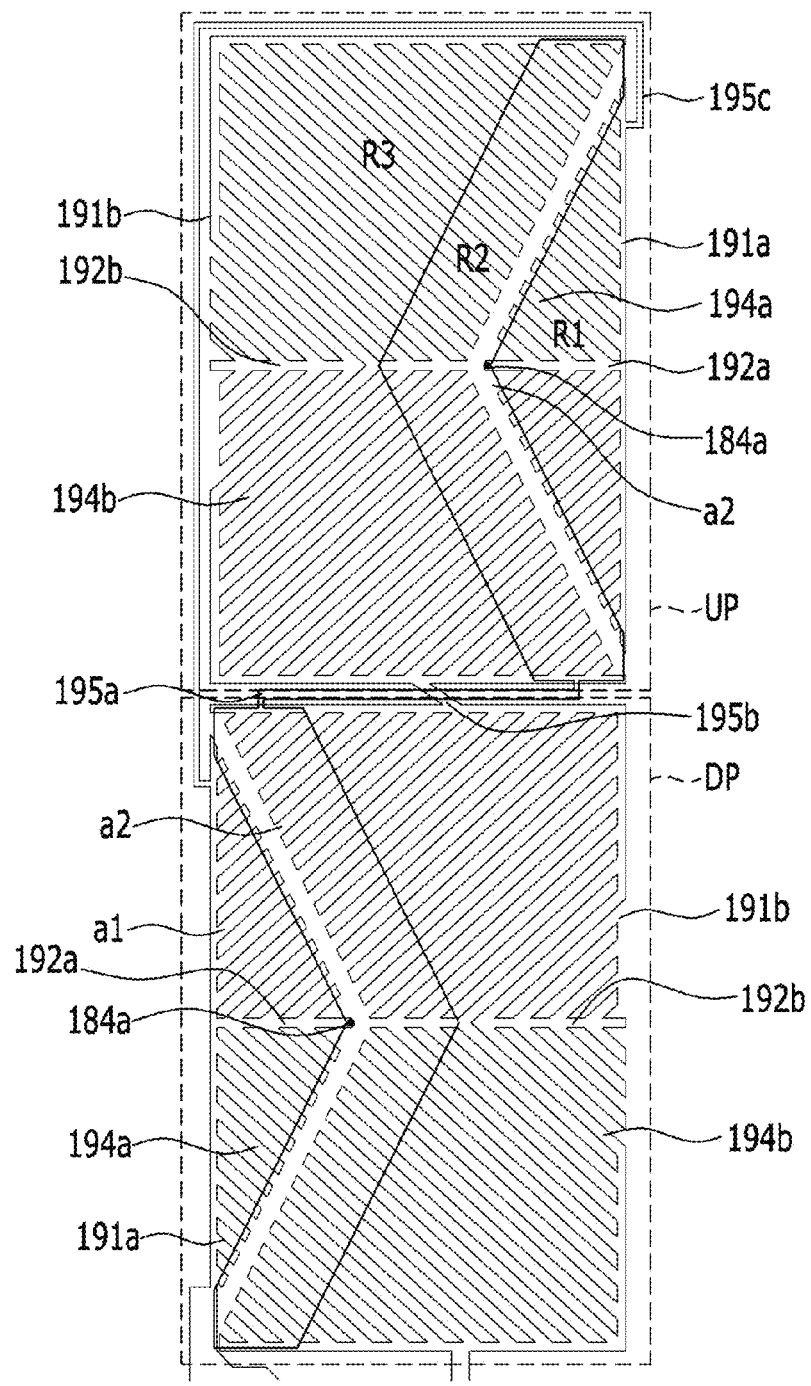
FIG. 9 is a top plan view of a basic pixel according to another exemplary embodiment of the present invention.
Figure 10:
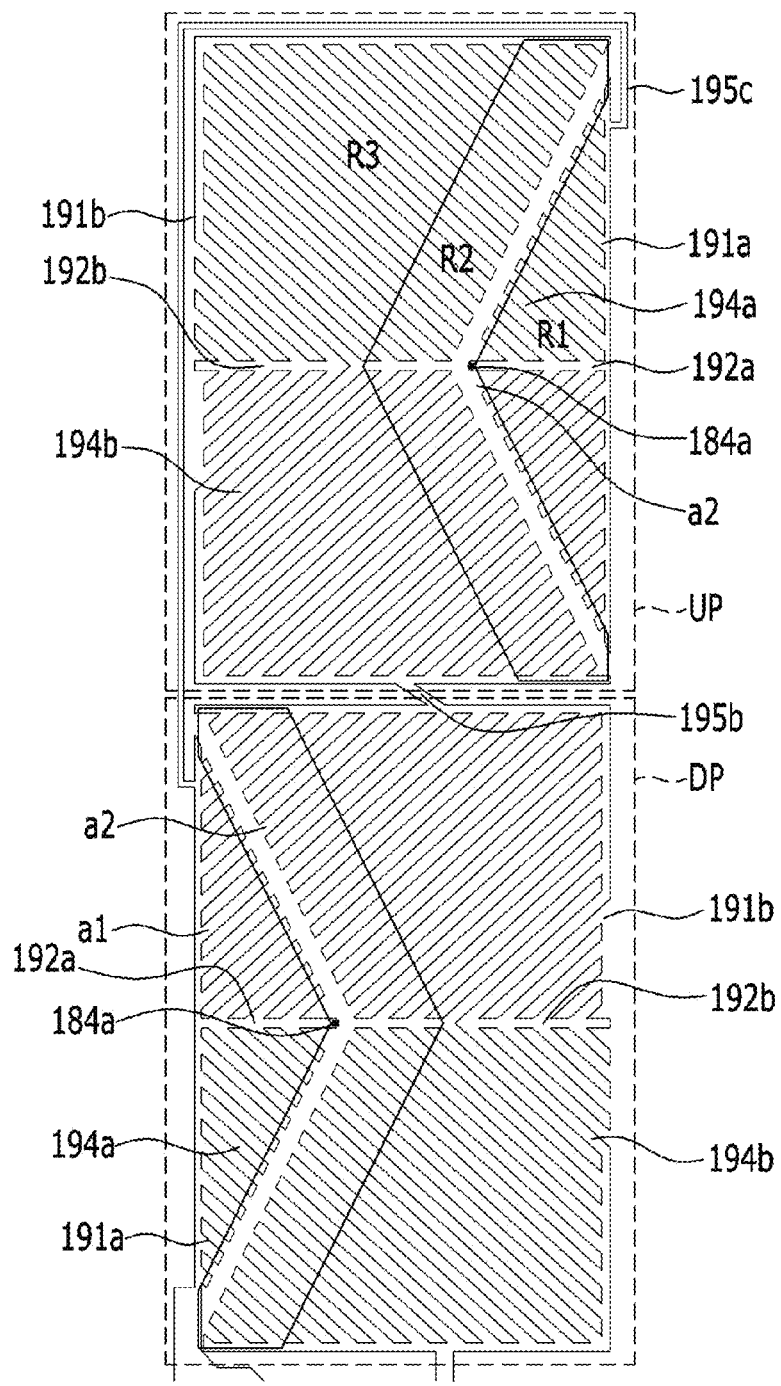
FIG. 10 is a top plan view of a basic pixel according to still another exemplary embodiment of the present invention.

A top plane view of a basic pixel electrode according to another exemplary embodiment of the present invention will be described with reference to FIGS. 9 and 10. FIG. 9 is a top plan view of a basic pixel according to an exemplary embodiment of the present invention, and FIG. 10 is a top plan view of a basic pixel according to an exemplary embodiment of the present invention. A description of components same as those of the exemplary embodiment of the present invention described above will be omitted.

Referring to FIG. 9, the first connector 195a connecting the second subregion electrodes a2 of the first subpixel electrode 191a located on the upper unit electrode UP and the lower unit electrode DP may be parallel to the horizontal stem parts 192a and 192b included in the pixel area.

Further, a part of the second horizontal stem part 192b included in the second subpixel electrode 191b is removed. Specifically, the second horizontal stem part 192b is removed in the part where the second subpixel electrode 191b and the second subregion electrode a2 of the first subpixel electrode 191a overlap each other.

Accordingly, the second subregion electrode a2 of the first subpixel electrode 191a receiving the first voltage and a part of the first subregion electrode a1 of the first subpixel electrode 191a, which is electrically connected to the second subregion electrode a2 and does not overlap the second subpixel electrode 191b since the second horizontal stem part of the second subpixel electrode 191b has been removed, form the first part R1 generating the electric field with the common electrode 270.

Further, a part of the second subpixel electrode 191*b* which does not overlap the second subregion electrode a2 and receives the second voltage may form the third part R3 generating the electric field with the common electrode 270 located on the upper display panel.

Lastly, an area where the plurality of second fine branch parts 194*b* overlapping the second subregion electrode a2 generate the electric field with the common electrode 270 and the second subregion electrode a2 generates the electric field with the common electrode 270 forms the second part R2.

The intensities of the electric fields are smaller in an order of the first part R1, the second part R2, and the third part R3 as described above.

According to the present exemplary embodiment as described above, the texture appearance may be reduced in the area where the second horizontal stem part is removed and the area where the second connector is located in comparison with an exemplary embodiment of the present invention.

Another exemplary embodiment of the present invention will be described with reference to FIG. 10. Referring to FIG. 10, the exemplary embodiment has no connector for directly connecting the first subregion electrodes a1 located on the upper unit electrode UP and the lower unit electrode DP. Each of the first subregion electrodes a1 may receive a voltage through the contact hole 184*a* electrically connected with the second subregion electrode a2.

Further, similar to FIG. 9, a part of the second horizontal branch part included in the second subpixel electrode 191*b* is removed. Specifically, the second horizontal stem part 192*b* is removed in the part where the second subpixel electrode 191*b* and the first subregion electrode a1 of the first subpixel electrode 191*a* overlap each other.

Accordingly, the second subregion electrode a2 of the first subpixel electrode 191*a* receiving the first voltage and a part of the first subregion electrode a1 of the first subpixel electrode 191*a*, which is electrically connected to the second subregion electrode a2 and does not overlap the second subpixel electrode 191*b* since the second horizontal stem part of the second subpixel electrode 191*b* has been removed, form the first part R1 generating the electric field together with the common electrode 270.

Further, a part of the second subpixel electrode 191*b* which does not overlap the second subregion electrode a2 and receives the second voltage may form the third part R3 generating the electric field with the common electrode 270 located on the upper display panel.

Lastly, an area where the plurality of second fine branch parts 194*b* overlapping the second subregion electrode a2 generate the electric field with the common electrode 270 and the second subregion electrode a2 generates the electric field with the common electrode 270 forms the second part R2.

As described above, the intensities of the electric fields are smaller in an order of the first part R1, the second part R2, and the third part R3. According to such an exemplary embodiment, the texture appearance generated due to the first connector connecting the second subregion electrodes can be reduced.

Figure 11A:
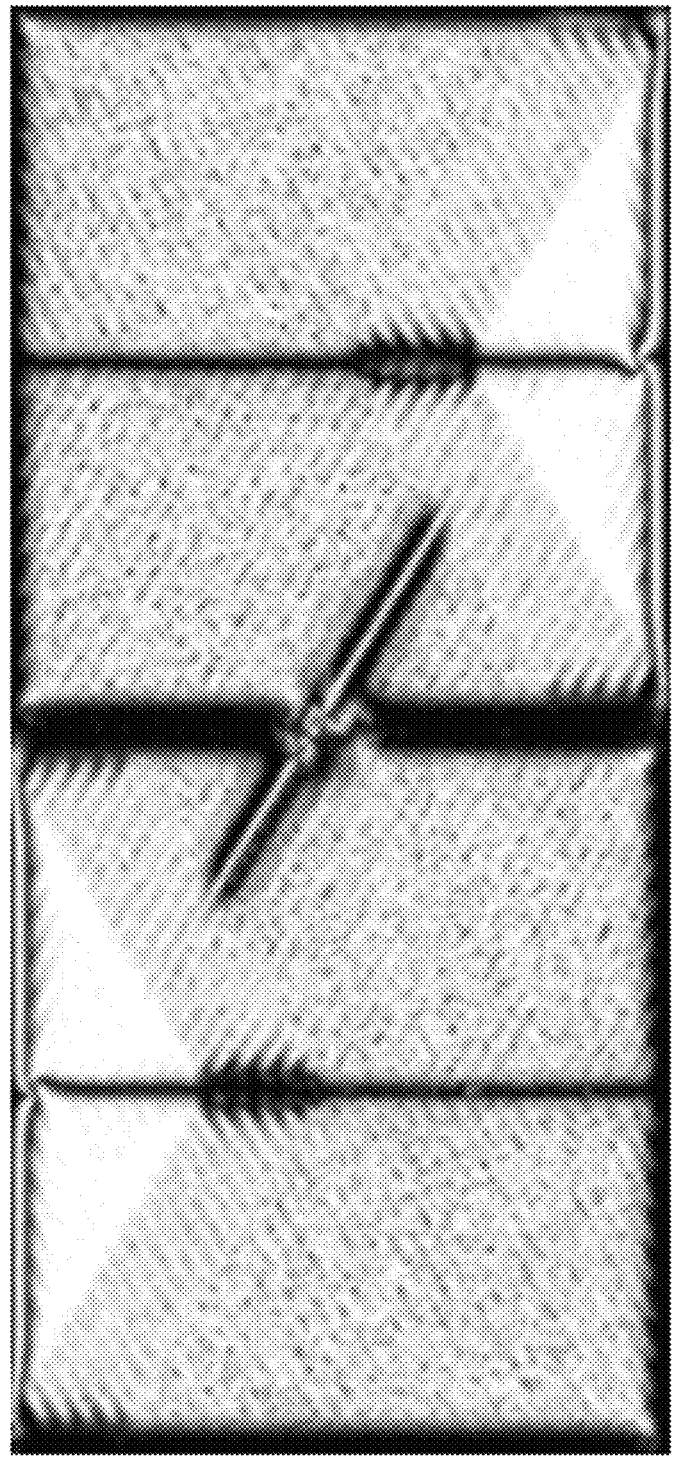
FIGS. 11A, 11B, and 11C are images of a pixel area according to an exemplary embodiment of the present invention.
Figure 11B:
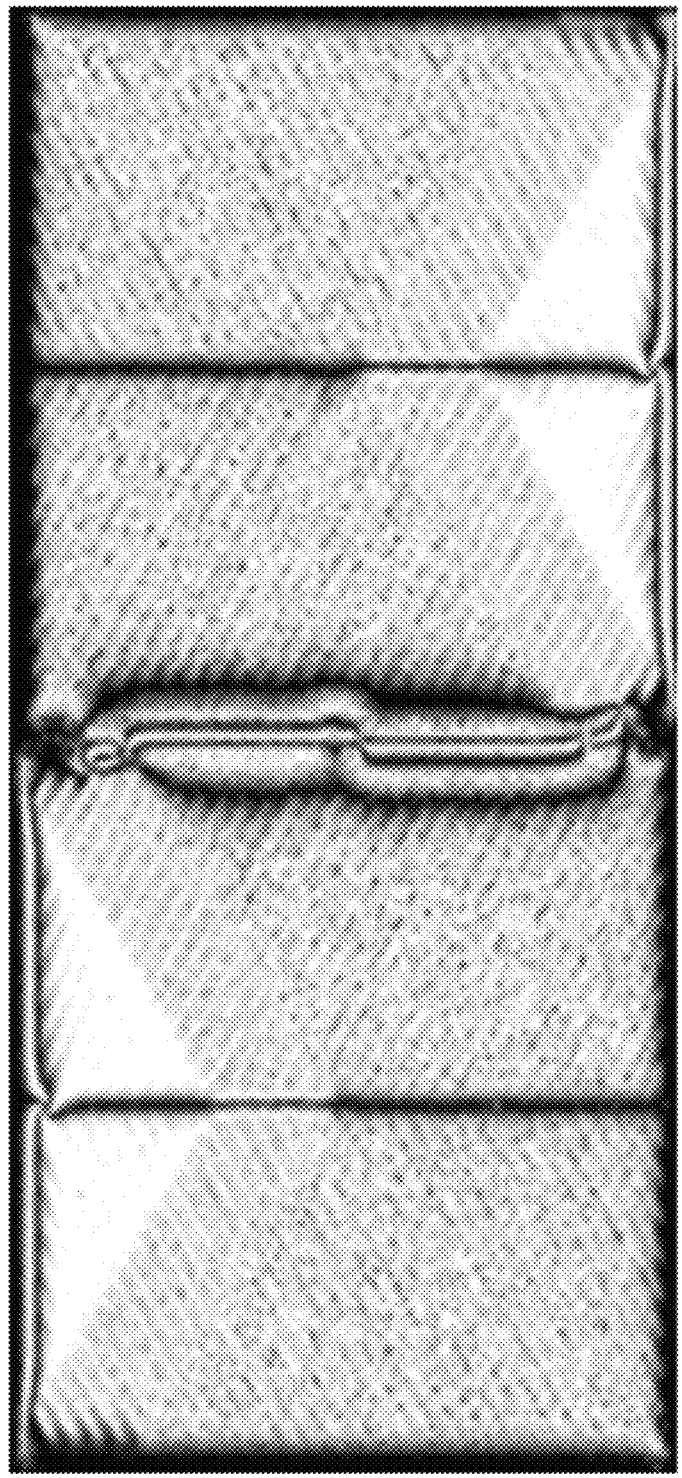
Figure 11C:
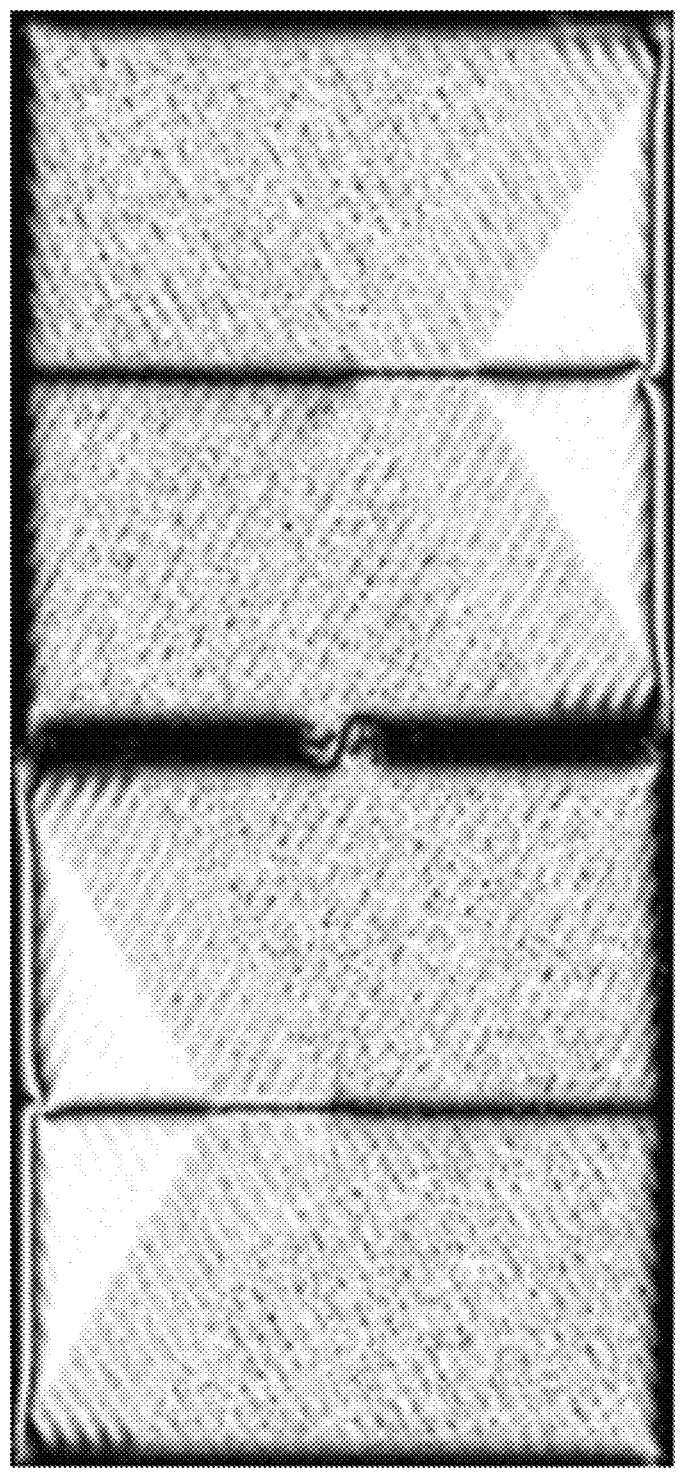
Figure 12:
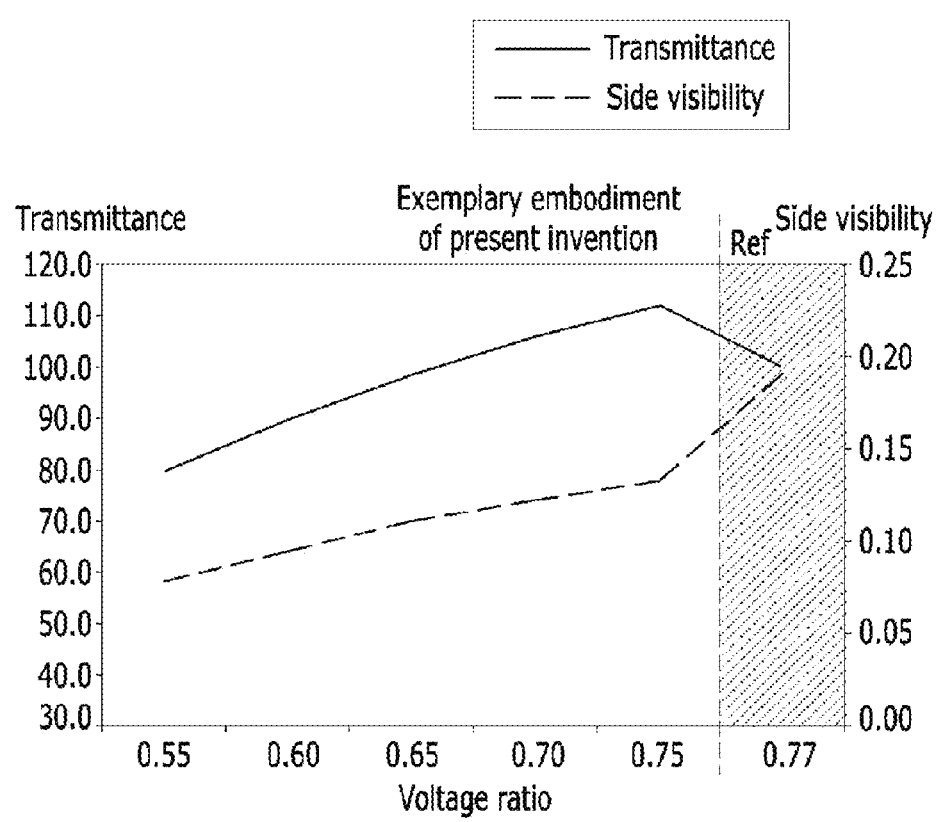
FIG. 12 is a graph showing transmittance and visibility according to an exemplary embodiment of the present invention.
Figure 13:
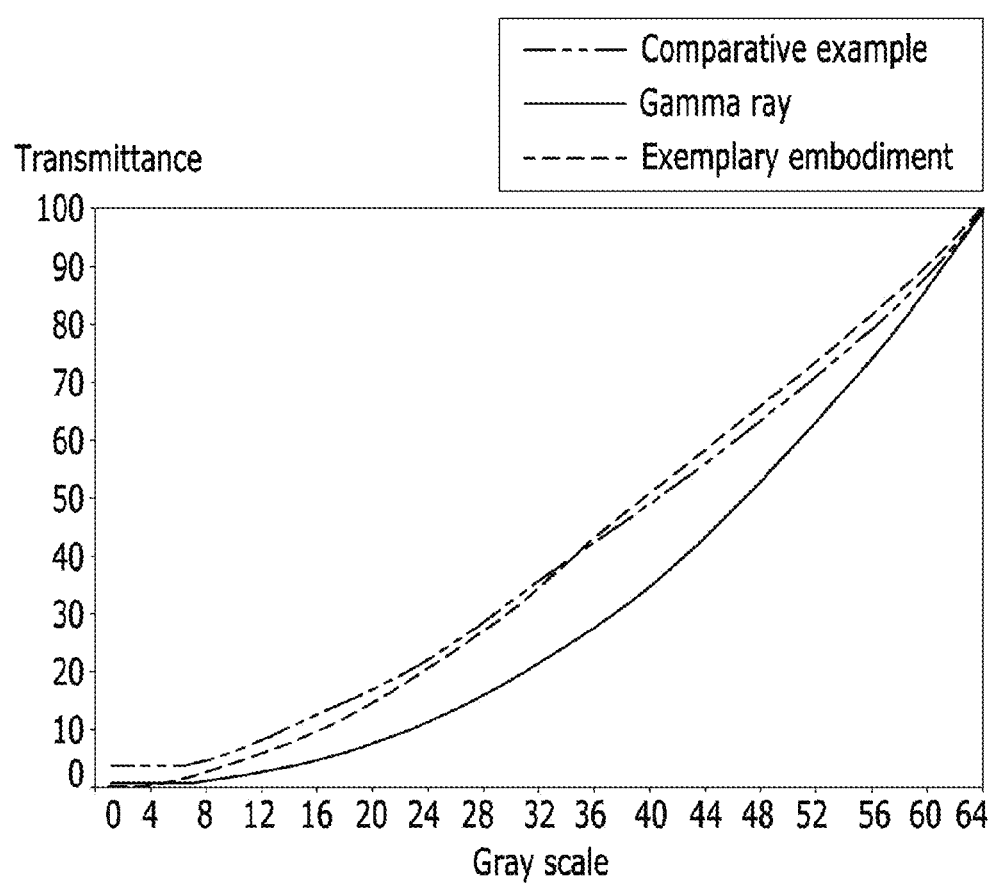
FIG. 13 is a graph showing transmittance against a gray scale according to an exemplary embodiment of the present invention.

Hereinafter the display device according to exemplary embodiments of the present invention will be described with reference to FIGS. 11A, 11B, 11C, 12, and 13. FIGS. 11A, 11B, and 11C illustrate images of the pixel area according to an exemplary embodiment of the present invention, FIG. 12 is a graph of transmittance and visibility according to an exemplary embodiment of the present invention, and FIG. 13 is a graph showing transmittance with respect to a gray scale according to an exemplary embodiment of the present invention.

FIG. 11A is an image of one pixel area according to an exemplary embodiment of the present invention illustrated in FIGS. 2A and 5, FIG. 11B is an image of the pixel area according to the exemplary embodiment illustrated in FIG. 9, and FIG. 11C is an image of the pixel area according to the exemplary embodiment illustrated in FIG. 10.

Referring to FIG. 11A, the exemplary embodiment of the present invention shows little texture generation except for the texture by the first connector connecting the second subregion electrodes a2 located between the upper unit electrode UP and the lower unit electrode DP and the texture generated in the area where the second subregion electrode a2 and the horizontal stem part of the second subpixel electrode 191*b* overlap each other.

Referring to FIG. 11B, even though the texture partially appears by the first connector parallel to the horizontal stem part, the exemplary embodiment of the present invention may eliminate the texture appearing in the corresponding area by removing a part of the second horizontal stem part of the second subpixel electrode 191*b* overlapping the second subregion electrode a2 as illustrated in FIG. 9.

Further referring to FIG. 11C, the exemplary embodiment of the present invention may eliminate the texture generated by the first connector as illustrated in FIG. 10.

Referring to FIG. 12, rightmost side of the graph shows a comparative example for the present invention that has a side visibility index of about 0.18 and transmittance of about 90%. According to the transmittance and the side visibility of the exemplary embodiment of the present invention, the transmittance may increase as a voltage ratio increases and the side visibility may increase as the voltage ratio decreases. The transmittance and the side visibility have somewhat a trade-off characteristic. The display device according to an exemplary embodiment of the present invention may properly select the trade-off characteristic point that has improved side visibility while maintaining same transmittance compared with the conventional comparative example.

Referring to FIG. 13, with reference to an ideal gamma curve, compare to the comparative example, the display device according to an exemplary embodiment of the present invention shows lower transmittance at a low gray scale but may have higher transmittance toward a high gray scale.

Accordingly, the display device according to an exemplary embodiment of the present invention has improved side visibility against the high transmittance, and particularly may considerably reduce the texture appearance in providing the curved display device.

Hereinafter a circuit diagram of the display device according to the exemplary embodiment of the present invention will be described with reference to FIGS. 14, 15, 16, 17, and 18.

First, an operation of a pixel PX illustrated in FIG. 14 will be described. When a gate on voltage (Von) is applied to the gate line 121, the first switching element Qa, the second switching element Qb, and the third switching element Qc that are connected to the gate line 121 are turned on. Accordingly, a data voltage applied to the data line 171 is applied to a first liquid crystal capacitor Clca and a second liquid crystal capacitor Clcb through the turned on first switching element Qa and second switching element Qb, respectively, and thus the first liquid crystal capacitor Clca and the second liquid crystal capacitor Clcb are charged by a difference between the data voltage and a common voltage Vcom. At this time, the same data voltage is transmitted to the first liquid crystal capacitor Clca and the second liquid crystal capacitor Clcb through the first and second switching elements Qa and Qb, but the charging voltage of the second liquid crystal capacitor Clcb is divided through the third switching element Qc. Accordingly, the charging voltage of the second liquid crystal capacitor Clcb becomes smaller than the charging voltage of the first liquid crystal capacitor Clca, so that the two subpixels PXa and PXb may have different luminance. Accordingly, by properly controlling the voltage charged to the first liquid crystal capacitor Clca and the voltage charged to the second liquid crystal capacitor Clcb, an image viewed from the side may become the most similar to an image viewed from the front, thereby improving the side visibility.

However, a structure of the pixel PX of the liquid crystal display according to the exemplary embodiment of the present invention is not limited to the exemplary embodiment illustrated in FIG. 14.

Figure 15:
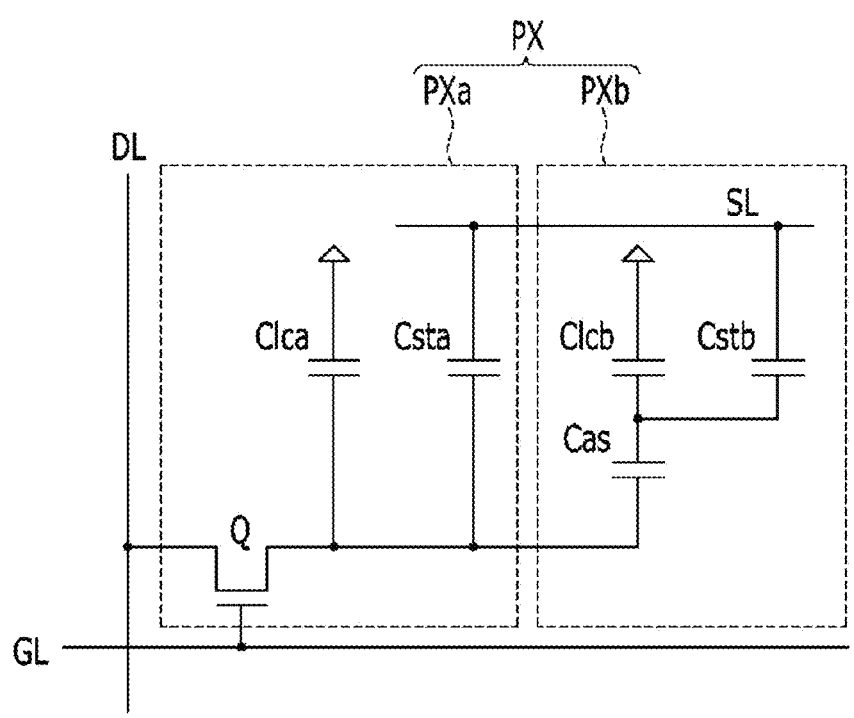
FIGS. 15 to 18 are circuit diagrams according to another exemplary embodiment of the present invention.

Hereinafter an exemplary embodiment of FIG. 15 will be described.

The liquid crystal display according to the exemplary embodiment of the present invention includes signal lines including a plurality of gate lines GL, a plurality of data lines DL, and a plurality of storage electrode lines SL, and a plurality of pixels PX connected to the signal lines. Each of the pixels PX includes a pair of first and second subpixels PXa and PXb. A first subpixel electrode is formed on the first subpixel PXa, and a second subpixel electrode is formed on the second subpixel PXb.

The liquid crystal display according to the exemplary embodiment of the present invention further includes a switching element Q connected to the gate line GL and the data line DL, a first liquid crystal capacitor Clca and a first storage capacitor Csta connected to the switching element Q and formed on the first subpixel PXa, a second liquid crystal capacitor Clcb and a second storage capacitor Cstb connected to the switching element Q and formed on the second subpixel PXb, and an auxiliary capacitor Cas formed between the switching element Q and the second liquid crystal capacitor Clcb.

The switching element Q is a three terminal element, such as a thin film transistor arranged at the lower display panel 100. The switching element Q may include a control terminal connected to the gate line GL, an input terminal connected to the data line DL, and an output terminal connected to the first liquid crystal capacitor Clca, the first storage capacitor Csta, and the auxiliary capacitor Cas.

One terminal of the auxiliary capacitor Cas is connected to the output terminal of the switching element Q and the other terminal is connected to the second liquid crystal capacitor Clcb and the second storage capacitor Cstb.

By making a charging voltage of the second liquid crystal capacitor Clcb lower than a charging voltage of the first liquid crystal capacitor Clca through the auxiliary capacitor Cas, the side visibility of the liquid crystal display can be improved.

Figure 16:
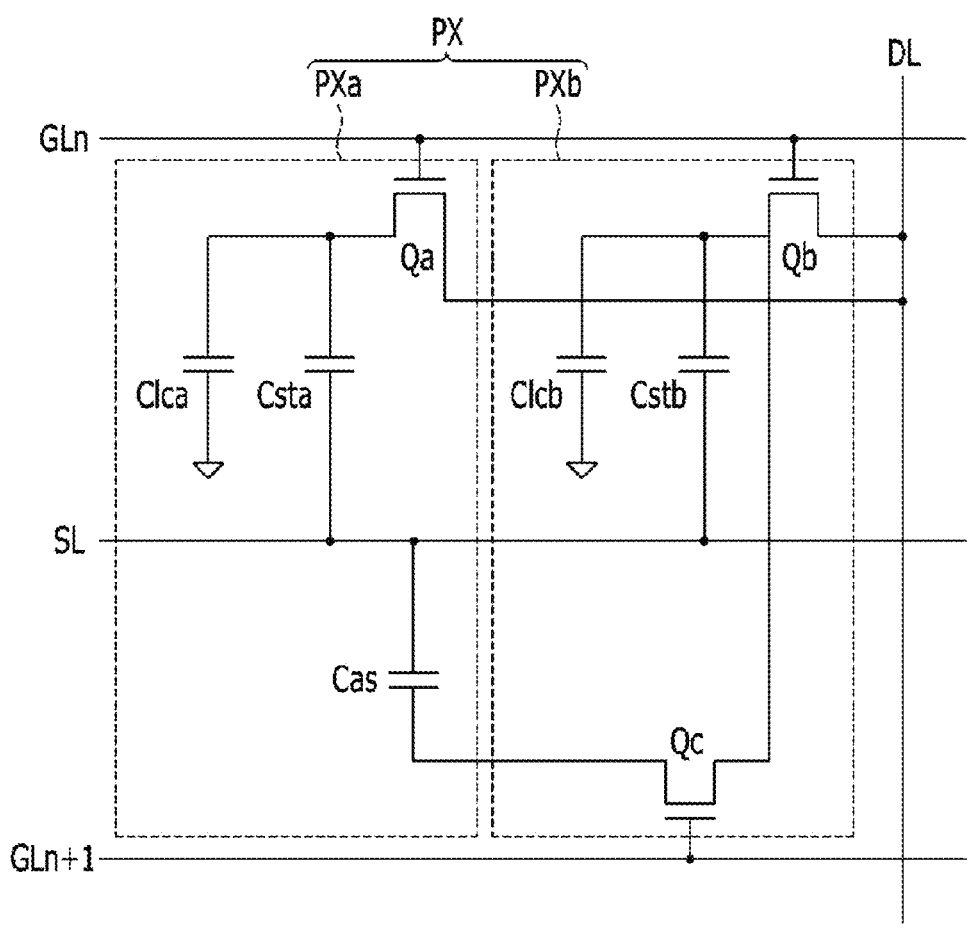

Hereinafter an exemplary embodiment of FIG. 16 will be described.

The liquid crystal display according to the exemplary embodiment of the present invention includes signal lines including a plurality of gate lines GLn and GLn+1, a plurality of data lines DL, and a plurality of storage electrode lines SL, and a plurality of pixels PX connected to the signal lines. Each of the pixels PX includes a pair of first and second subpixels PXa and PXb. A first subpixel electrode is formed on the first subpixel PXa and a second subpixel electrode is formed on the second subpixel PXb.

The liquid crystal display according to the exemplary embodiment of the present invention further includes a first switching element Qa and a second switching element Qb connected to the gate line GLn and the data line DL, a first liquid crystal capacitor Clca and a first storage capacitor Csta connected to the first switching element Qa and formed on the first subpixel PX, a second liquid crystal capacitor Clcb and a second storage capacitor Cstb connected to the second switching element Qb and formed on the second subpixel, a third switching element Qc connected to the second switching element Qb and switched by a next gate line GLn+1, and an auxiliary capacitor Cas connected to the third switching element Qc.

The first switching element Qa and the second switching element Qb are three terminal elements, such as a thin film transistor arranged at the lower display panel 100. The first switching element Qa and the second switching element Qb each include control terminals connected to the gate lines GLn, input terminals connected to the data lines DL, and output terminals respectively connected to the first liquid crystal capacitor Clca and the first storage capacitor Csta, and the second liquid crystal capacitor Clcb and the second storage capacitor Cstb.

The third switching element Qc also corresponds to the three terminal element, such as the thin film transistor arranged at the lower display panel 100. The third switching element Qc may include a control terminal connected to the next gate line GLn+1, an input terminal connected to the second liquid crystal capacitor Clcb, and an output terminal connected to the auxiliary capacitor Cas.

One terminal of the auxiliary capacitor Cas is connected to the output terminal of the third switching element Qc and the other terminal is connected to the storage electrode line SL.

An operation of the liquid crystal display according to the exemplary embodiment of the present invention will be described. When the gate on voltage is applied to the gate line GLn, the first switching element and the second switching element Qa and Qb connected to the gate line GLn are turned on and the data voltage of the data line 171 is applied to the first and second subpixel electrodes.

Subsequently, when a gate off voltage is applied to the gate line GLn and the gate on voltage is applied to the next gate line GLn+1, the first and second switching elements Qa and Qb are turned off and the third switching element Qc is turned on. Accordingly, a charge of the second subpixel electrode connected to the output terminal of the second switching element Qb flows in the auxiliary capacitor Cas, so as to drop the voltage of the second liquid crystal capacitor Clcb.

As described above, by making the charging voltages of the first and second liquid crystal capacitors Clca and Clcb different, the side visibility of the liquid crystal display can be improved.

Hereinafter an exemplary embodiment of FIG. 17 will be described.

The liquid crystal display according to the exemplary embodiment of the present invention includes signal lines including a plurality of gate lines GL, a plurality of data lines DL1 and DL2, and a plurality of storage electrode lines SL, and a plurality of pixels PX connected to the signal lines. Each of the pixels PX includes a pair of first and second liquid crystal capacitors Clca and Clcb and a pair of first and second storage capacitors Csta and Cstb.

Each of the subpixels includes one liquid crystal capacitor and one storage capacitor and further includes one thin film transistor Q. The thin film transistors Q of two subpixels included in one pixel are connected to the same gate line GL and different data lines DL1 and DL2. The different data lines DL1 and DL2 simultaneously apply data voltages at different levels to allow the first and second liquid crystal capacitors Clca and Clcb of the two subpixels to have different charging voltages. As a result, the side visibility of the liquid crystal display can be improved.

Figure 18:
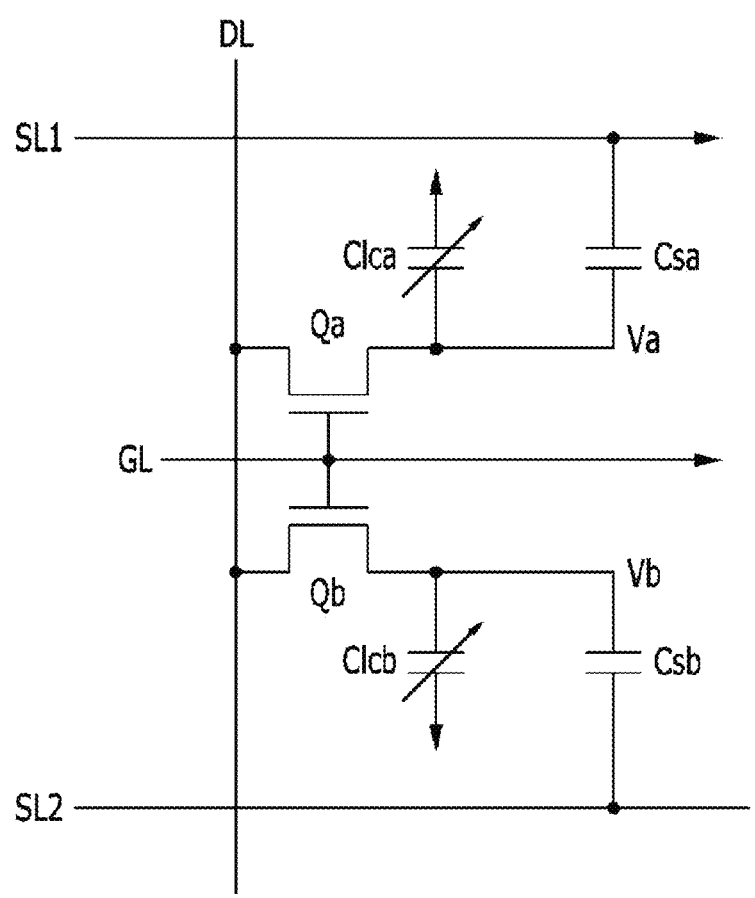

Hereinafter an exemplary embodiment of FIG. 18 will be described.

Figure 17:
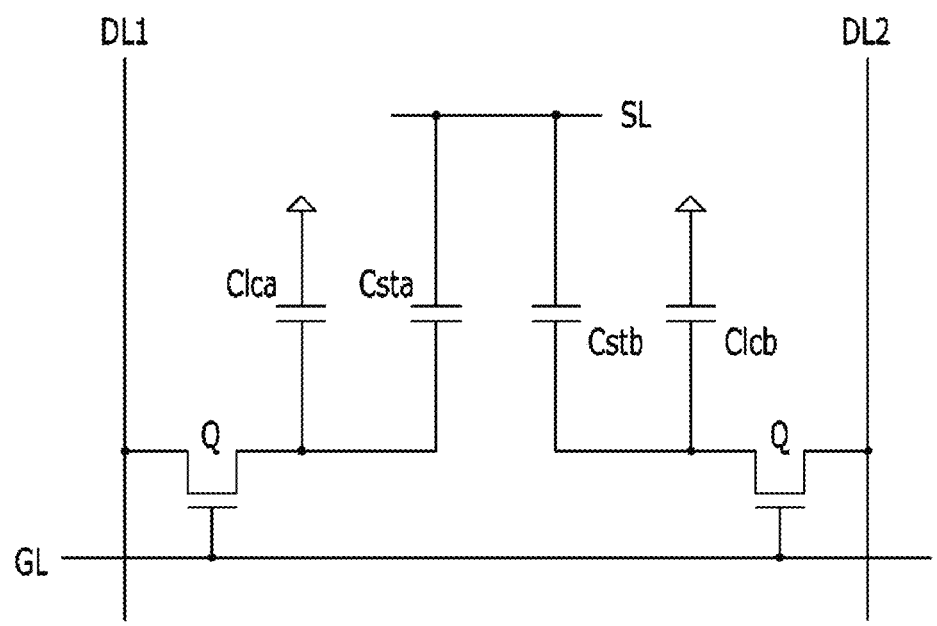

The liquid crystal display according to the exemplary embodiment of the present invention includes the gate line GL, the data line DL, a first power line SL1, a second power line SL2, and the first switching element Qa and the second switching element Qb connected to the gate line GL and the data line DL as illustrated in FIG. 17.

The liquid crystal display according to the exemplary embodiment of the present invention further include an auxiliary step-up capacitor Csa and a first liquid crystal capacitor Clca connected to the first switching element Qa, and an auxiliary step-down capacitor Csb and a second liquid crystal capacitor Clcb connected to the second switching element Qb.

The first switching element Qa and the second switching element Qb are formed with a three terminal element, such as the thin film transistor and the like. The first switching element Qa and the second switching element Qb are connected to the same gate line GL and the same data line DL, so as to be turned on at the same timing and output the same data signal.

The first power line SL1 and the second power line SL2 are applied a voltage swing according to a set time period. A first low voltage is applied to the first power line SL1 for a first set time period (for example, 1H) and a first high voltage is applied to the first power line SL1 for a second set time period. A second high voltage is applied to the second power line SL2 for a first set time period and a second low voltage is applied to the second power line SL2 for a second set time period. At this time, the first set time period and the second set time period are repeated several times during one frame, and thus the first power line SL1 and the second power line SL2 are applied the swing voltage. At this time, the first low voltage and the second low voltage may be the same and the first high voltage and the second high voltage may also be the same.

The auxiliary step-up capacitor Csa is connected to the first switching element Qa and the first power line SL1 and the auxiliary step-down capacitor Csb is connected to the second switching element Qb and the second power line SL2.

A voltage Va of a terminal (hereinafter referred to as a "first terminal") of a part where the auxiliary step-up capacitor Csa is connected to the first switching element Qa becomes lower when the first low voltage is applied to the first power line SL1, and becomes higher when the first high voltage is applied to the first power line SL1. Thereafter, as the voltage of the first power line SL1 swings, the voltage Va of the first terminal also swings.

Further, a voltage Vb of a terminal (hereinafter referred to as a "second terminal") of a part where the auxiliary step-down capacitor Csb is connected to the first switching element Qa becomes higher when the second high voltage is applied to the second power line SL2, and become slower when the second low voltage is applied to the second power line SL2. Thereafter, as the voltage of the second power line SL2 swings, the voltage Vb of the second terminal also swings.

As described above, since the voltages Va and Vb of the pixel electrodes of the two subpixels are changed according to sizes of the voltages swing in the first and second power lines SL1 and SL2 even though the same data voltage is applied to the two subpixels, the transmittance of the two subpixels can become different from each other and the side visibility can be improved.

In the exemplary embodiments of FIGS. 15 to 18, the display quality can be improved by forming any line parallel to the data line to vertically cross the center of the display area of the pixels without using the reference voltage line.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a first insulation substrate;
   an insulating layer disposed on the first insulation substrate;
   a pixel electrode comprising:
      a first subpixel electrode comprising a first subregion electrode disposed on the insulating layer and a second subregion electrode disposed below the insulating layer; and
      a second subpixel electrode disposed on the insulating layer,
      wherein a first voltage is applied to the first subpixel electrode and a second voltage is applied to the second subpixel electrode;
   a second insulation substrate facing the first insulation substrate; and
   a common electrode disposed on the second insulation substrate and configured to receive a common voltage, wherein
   the second subregion electrode overlaps a portion of the second subpixel electrode,
   a voltage difference between the first voltage and the common voltage is larger than a voltage difference between the second voltage and the common voltage,
   an area of the pixel electrode comprises a first part where the first subregion electrode is located, a second part where the second subregion electrode overlaps the second subpixel electrode, and a third part where the second subpixel electrode does not overlap the second subregion electrode, and
   the first subregion electrode and the second subpixel electrode comprise branch parts extending in two different directions.

2. The display device of claim 1, wherein a voltage difference between the common voltage and the voltage of the pixel electrode decreases in an order of the first part, the second part, and the third part.

3. The display device of claim 2, wherein the first subpixel electrode and the second subpixel electrode each comprise an upper unit electrode and a lower unit electrode that are disposed adjacent to one another and separated by a gap in between.

4. The display device of claim 3, wherein the pixel electrode further comprises:

a first connector connecting the upper unit electrode and the lower unit electrode of the first subpixel electrode; and a second connector connecting the upper unit electrode and the lower unit electrode of the second subpixel electrode.

5. The display device of claim 4, wherein the first connector is disposed on the same layer as either one of the first subregion electrode or the second subregion electrode.

6. The display device of claim 5, wherein the first connector is disposed on the same layer as the first subregion electrode and is parallel to the stem parts.

7. The display device of claim 4, wherein the second connector extends between branch parts of the first subregion electrode.

8. The display device of claim 2, wherein the first subregion electrode and the second subregion electrode are electrically connected to each other through a contact hole.

9. The display device of claim 2, wherein the second subregion electrode comprises a planar portion that overlaps the second subpixel electrode.

10. The display device of claim 2, wherein:
each of the first subregion electrode and the second subpixel electrode comprises a horizontal stem part, and
the branch parts extend from two sides of the horizontal stem parts.

11. The display device of claim 10, further comprising:
a lower display panel including the first insulation substrate, the insulating layer, and the pixel electrode;
an upper display panel including the second insulation substrate and the common electrode; and
a liquid crystal layer disposed between the lower display panel and the upper display panel and comprising liquid crystal molecules,
wherein the liquid crystal molecules disposed at a first side of each stem part are arranged in a first direction when an electric field is applied thereto, and
the liquid crystal molecules disposed at a second side of each stem part are arranged in a second direction when an electric field is applied thereto.

12. The display device of claim 10, wherein the branch parts disposed at the first side of each stem part and the branch parts disposed at the second side of each stem part substantially extend in opposite directions.

13. The display device of claim 12, wherein the stem part of the second subpixel electrode does not overlap the first subregion electrode.

14. The display device of claim 2, wherein the first subregion electrode and the second subpixel electrode together form a quadrangle.

15. The display device of claim 14, wherein the first subregion electrode and the second subpixel electrode are divided from each other by a gap having different slopes with respect to the corresponding stem parts.

16. The display device of claim 15, wherein the second subregion electrode has a plate shape corresponding to the shape of the gap.

17. The display device of claim 1, wherein the display device is a curved display device having a curvature radius.

18. The display device of claim 1, further comprising:
a first thin film transistor connected to the first subpixel electrode;
a second thin film transistor connected to the second subpixel electrode; and
a voltage dividing transistor connected to the second thin film transistor.

* * * * *